US009947804B1

United States Patent
Frougier et al.

(10) Patent No.: US 9,947,804 B1
(45) Date of Patent: Apr. 17, 2018

(54) METHODS OF FORMING NANOSHEET TRANSISTOR WITH DIELECTRIC ISOLATION OF SOURCE-DRAIN REGIONS AND RELATED STRUCTURE

(71) Applicant: GLOBALFOUNDRIES Inc., Grand Cayman (KY)

(72) Inventors: Julien Frougier, Albany, NY (US); Min Gyu Sung, Latham, NY (US); Ruilong Xie, Niskayuna, NY (US); Chanro Park, Clifton Park, NY (US); Steven Bentley, Menands, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/657,659

(22) Filed: Jul. 24, 2017

(51) Int. Cl.
*H01L 21/84* (2006.01)
*H01L 29/786* (2006.01)
*H01L 29/423* (2006.01)
*H01L 29/45* (2006.01)
*H01L 27/088* (2006.01)
*H01L 21/8234* (2006.01)

(52) U.S. Cl.
CPC .......... *H01L 29/78696* (2013.01); *H01L 21/823412* (2013.01); *H01L 27/088* (2013.01); *H01L 29/42392* (2013.01); *H01L 29/458* (2013.01)

(58) Field of Classification Search
CPC ....... H01L 29/78696; H01L 21/823412; H01L 27/088; H01L 29/42392; H01L 29/458; H01L 21/02603; H01L 21/02606; H01L 29/0669; H01L 29/413; H01L 2221/1094; H01L 21/02293; H01L 21/20

USPC ........ 257/288, 368, 369; 438/151, 197, 199; 977/762, 938
See application file for complete search history.

(56) References Cited

U.S. PATENT DOCUMENTS

| | | | |
|---|---|---|---|
| 8,748,940 B1 | 6/2014 | Rachmady et al. | |
| 9,276,064 B1* | 3/2016 | Zang | H01L 29/0673 |
| 9,318,553 B1* | 4/2016 | Cheng | H01L 29/0673 |
| 9,728,466 B1* | 8/2017 | Mallela | H01L 21/82381 |
| 9,741,812 B1* | 8/2017 | Adusumilli | H01L 29/45 |
| 9,750,551 B1* | 9/2017 | Nichols | A61B 17/8061 |
| 9,837,414 B1* | 12/2017 | Balakrishnan | H01L 27/0921 |
| 2013/0020707 A1 | 1/2013 | Or-Bach et al. | |
| 2013/0095580 A1 | 4/2013 | Or-Bach et al. | |

(Continued)

*Primary Examiner* — Shahed Ahmed
(74) *Attorney, Agent, or Firm* — Yuanmin Cai; Hoffman Warnick LLC

(57) ABSTRACT

An IC structure according to the disclosure includes: a substrate; a pair of transistor sites positioned on the substrate, wherein an upper surface of the substrate laterally between the pair of transistor sites defines a separation region; a pair of nanosheet stacks, each positioned on one of the pair of transistor sites; an insulative liner conformally positioned on the upper surface of the substrate within the separation region, and a sidewall surface of each of the pair of transistor sites; a semiconductor mandrel positioned on the insulative liner and over the separation region; a pair of insulator regions each positioned laterally between the semiconductor mandrel and the insulative liner on the sidewall surfaces of each of the pair of transistor sites; and a source/drain epitaxial region positioned over the pair of insulator regions and the semiconductor mandrel, wherein the source/drain epitaxial region laterally abuts the pair of nanosheet stacks.

14 Claims, 25 Drawing Sheets

(56) References Cited

U.S. PATENT DOCUMENTS

| | | |
|---|---|---|
| 2013/0122672 A1 | 5/2013 | Or-Bach et al. |
| 2014/0091360 A1 | 4/2014 | Pillarisetty et al. |
| 2016/0104799 A1 | 4/2016 | Qi et al. |
| 2017/0271514 A1* | 9/2017 | Kittl .................... H01L 29/7848 |

* cited by examiner

METHODS OF FORMING NANOSHEET TRANSISTOR WITH DIELECTRIC ISOLATION OF SOURCE-DRAIN REGIONS AND RELATED STRUCTURE

BACKGROUND

Technical Field

The present disclosure relates to integrated circuit (IC) design, and more particularly to IC structures based on electrically isolated stacked nanosheet Field Effect Transistor structures using bottom dielectric isolation of the Source and Drain contacts, and methods of forming the same.

Related Art

A nanosheet transistor refers to a type of field-effect transistor (FET) that includes a plurality of stacked nanosheets extending between a pair of source/drain epitaxial regions. FETs typically include doped source/drain epitaxial regions that are formed in a semiconductor substrate and separated by a channel region. A gate insulation layer is positioned above the channel region and a conductive gate electrode is positioned above the gate insulation layer. The gate insulation layer and the gate electrode together may be referred to as the "gate stack," "gate structure," etc., for the device. By applying an appropriate voltage to the gate electrode, the channel region becomes conductive and current is allowed to flow between source regions and drain regions of the structure.

To improve the operating speed of the FETs, and to increase the density of FETs on an integrated circuit (IC), designs have gradually become smaller in size. Reductions to the size and the channel length in FETs can improve the switching speed of the FETs. A number of challenges arise as feature sizes of FETs and ICs get smaller. For example, significant downsizing of conventional planar FETs may produce electrostatic issues and electron mobility degradation. Scaled-down planar FETs may have shorter gate lengths that make it more difficult to control the channel. Alternative device architectures such as "gate-all-around" nanowire or nanosheet structures allow further scaling of ICs, in part because the gate is structured to wrap around the channel. This structure can provide better control with lower leakage current, faster operations, and lower output resistance.

Differences in structure between nanosheet transistors and conventional transistor structures, and the processing needed to form nanosheet transistors, may be associated with differences in performance during operation. Such effects on performance can be difficult to manage in structures which include varying separation distances between individual transistors, e.g., two laterally adjacent transistors in a "short channel" region versus two laterally adjacent transistors in a "long channel" region of a device. In situations where nanosheet transistors with varying lateral separation are formed in a unified process, forming differently-sized structures in a single fabrication scheme may be a technical challenge. For example, loading effects of different processes may cause discrepancies between the processing of differently sized structures, e.g., more oxide or other substances may be formed in wider areas than in smaller areas. Loading effects and similar processing constraints can affect whether a single processing paradigm will successfully form the targeted transistor structures in one region of a device together with transistors in another region of a device with different physical size, separation, etc.

SUMMARY

A first aspect of the disclosure provides an integrated circuit (IC) structure including: a substrate having a pair of transistor sites, wherein an upper surface of the substrate laterally between the pair of transistor sites defines a separation region; a pair of nanosheet stacks, each positioned on one of the pair of transistor sites; an insulative liner conformally positioned on the upper surface of the substrate within the separation region; a semiconductor mandrel positioned on the insulative liner and over the separation region of the substrate; a pair of insulator regions each positioned laterally between the semiconductor mandrel and the insulative liner on the sidewall surfaces of each of the pair of transistor sites; and a source/drain epitaxial region positioned over the pair of insulator regions and the semiconductor mandrel, wherein the source/drain epitaxial region laterally abuts each of the pair of nanosheet stacks.

A second aspect of the disclosure provides a method of forming an integrated circuit (IC) structure, the method including: forming an insulative liner on an upper surface of a substrate, the substrate being included in a precursor structure, the precursor structure having: a pair of laterally spaced transistor sites defined within the substrate, wherein the insulative liner is formed on the upper surface of the substrate laterally between the pair of transistor sites, a pair of nanosheet stacks, each positioned on one of the pair of transistor sites, and a pair of gate structures each positioned on a respective one of the pair of nanosheet stacks; forming a sacrificial structure on the insulative liner, wherein the sacrificial structure includes: a semiconductor mandrel positioned on the insulative liner, and a mask layer positioned on the semiconductor mandrel, wherein an upper surface of the mask layer is positioned above the pair of gate structures; forming a pair of insulator regions, each of the pair of insulator regions positioned laterally between the sacrificial structure and one of the pair of transistor sites; and removing the mask layer to expose the upper surface of the semiconductor mandrel; and epitaxially growing a source/drain epitaxial region between the pair of nanosheet stacks, from exposed sidewalls of the pair of nanosheet stacks and the exposed upper surface of the semiconductor mandrel.

A third aspect of the disclosure provides a method of forming an integrated circuit (IC) structure, the method including: forming a first pair of transistor sites and a second pair of transistor sites from a substrate, wherein a lateral separation distance between the first pair of transistor sites is less than a separation distance between the second pair of transistor sites, and wherein each of the first pair of transistor sites and the second pair of transistor sites includes a pair of nanosheet stacks each positioned on a respective one of the pair of transistor sites, and a pair of gate structures each positioned on a respective one of the pair of transistor sites; selectively forming an insulative region between the first pair of transistor sites to cover a first portion of the substrate between the first pair of transistor sites, wherein the second pair of transistor sites and a second portion of the substrate between the second pair of transistor sites remain exposed after the selective forming of the insulative liner; epitaxially growing a first source/drain epitaxial region between the first pair of semiconductor transistor sites, from exposed portions of the pair of nanosheet stacks on the first pair of transistor sites, such that the first source/drain epitaxial region overlies the insulative region; and epitaxially growing a second source/drain epitaxial region between the second pair of semiconductor transistor sites, from the second portion of the substrate and exposed portions of the pair of nanosheet stacks on the second pair of transistor sites.

BRIEF DESCRIPTION OF THE DRAWINGS

The embodiments of this disclosure will be described in detail, with reference to the following figures, wherein like designations denote like elements, and wherein.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

The present disclosure relates to integrated circuit (IC) design, and more particularly to IC structures which include ("nanosheet transistors") using bottom dielectric isolation of the source and drain contacts, and methods of forming the same. Specifically, the present disclosure provides for various IC structures with insulative dielectric materials physically and electrically separating source and drain contacts from the substrate, and methods of forming the same. In a nanosheet transistor structure, electrical connection with the various nanosheets in a gate region acting as transistor channel may be provided through a semiconductive source/drain epitaxial region grown from the edges of the semiconductor nanosheets. The source/drain epitaxial regions formed in embodiments of the present disclosure may be positioned over dielectric material formed for processing consistency in multiple regions, and to provide physical and electrical separation from the substrate. The various embodiments discussed herein provide a uniform processing technique to form nanosheet transistors with electrically isolated source/drain epitaxial regions, and corresponding contacts, in multiple regions having varied lateral gate-to-gate separation distances, while maintaining the advantages associated with nanosheet transistor formation as compared to conventional processing.

It will also be understood that when an element such as a layer, region, or substrate is referred to as being "on" or "over" another element, it may be directly on the other element or intervening elements may also be present. In contrast, when an element is referred to as being "directly on" or "directly over" another element, there may are no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Methods as described herein may be used in the fabrication of IC chips. The resulting integrated circuit chips may be integrated with other chips, discrete circuit elements, and/or other signal processing devices as part of either (a) an intermediate product, such as a motherboard, or (b) an end product. The end product can be any product that includes integrated circuit chips.

Figure 1:
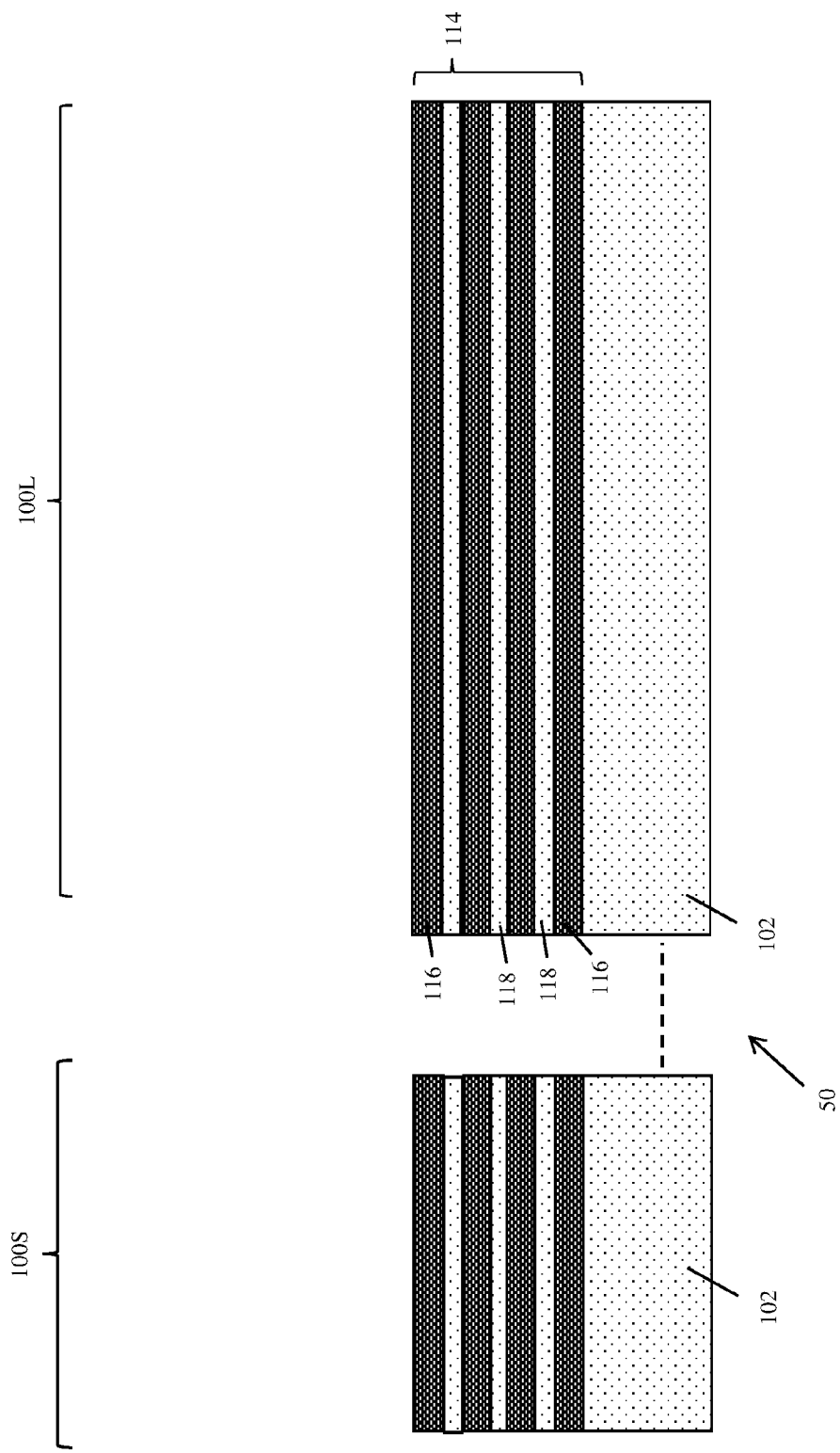
FIG. 1 shows a cross-sectional view of a substrate and nanosheet stacks to be processed into a preliminary structure according to the disclosure.

Referring to FIG. 1, a cross-sectional view of an initial nanosheet structure 50 to be processed according to embodiments of the disclosure is shown. Initial nanosheet structure 50 can be processed into a precursor structure 100 (FIG. 3) to be processed according to embodiments, and may represent a portion of a larger IC structure for fabrication into precursor structure 100 described herein. Initial nanosheet structure 50 and precursor structure 100 can be structured to include a "short channel" region 100S and a "long channel" region 100L at respective portions thereof. As illustrated in FIG. 1 and described herein, the various components and subcomponents in each region 100S, 100L may be substantially or completely identical, aside from differences in lateral separation distance between the various components.

Initial nanosheet structure 50 may include a substrate 102. As shown, substrate 102 may include any currently-known or later developed material capable of being processed into a transistor structure, and may include, e.g., a bulk semiconductor layer, a semiconductor-on-insulator (SOI) substrate, etc., which may include one or more sites targeted for transistor formation, i.e., "transistor sites" as described elsewhere herein. Substrate 102 thus may overlie one or more other layers of material having distinct material and/or electrical properties, with such layers of material being omitted from the accompanying FIGS. to better illustrate structures and processes to form an IC structure according to the disclosure. Substrate 102 may include any currently known or later developed semiconductor material, which may include without limitation, silicon, germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, the entirety of substrate 102 or a portion thereof may be strained.

Substrate 102 may have a variety of configurations, such as the depicted bulk silicon configuration. Substrate 102 may also have a silicon-on-insulator (SOI) configuration that includes a bulk silicon layer, a buried insulation layer and an active layer, wherein semiconductor devices are formed in and above the active layer. Substrate 102 may be made of silicon or it may be made of materials other than silicon. Thus, the terms "substrate" or "semiconductor substrate" should be understood to cover all semiconducting materials and all forms of such materials. Where substrate 102 includes a fin-shaped semiconductor region, multiple substrates 102 may each be positioned on an underlying layer and oriented in parallel relative to one another. Substrate 102 of precursor structure 100 may be formed by forming a semiconductor material on an underlying structure (not shown). For the purposes of example and simplicity, other materials and/or layers positioned beneath substrate 102 have been omitted from the accompanying figures. In addition, the various cross-sectional views herein are shown to be in a "cross-gate direction." That is, substrate 102 and transistor sites 128 (FIG. 3) formed therefrom may be positioned laterally adjacent to a set of trenches, insulating materials, etc., for electrically isolating distinct transistor structures.

According to an example, substrate 102 can be formed by deposition and/or wafer bonding, e.g., separation by implantation of oxygen (SIMOX). As used herein, the term "depositing" may include any now known or later developed technique appropriate for deposition, including but not limited to, for example: chemical vapor deposition (CVD), low-pressure CVD (LPCVD), plasma-enhanced CVD (PECVD), semi-atmosphere CVD (SACVD) high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, and evaporation.

Precursor structure 100 can include a nanosheet stack 114 formed on substrate 102, e.g., by epitaxial growth, and which may include alternating layers of material positioned over substrate 102. Nanosheet stack 114 may include, e.g., a plurality of alternating semiconductor nanosheets 116 and sacrificial nanosheets 118. Semiconductor nanosheets 116 and sacrificial nanosheets 118 can initially be formed as alternating layers of material on the upper surface of substrate 102. Semiconductor nanosheets 116 can be formed from any currently known or later developed semiconductor material, e.g., silicon, with the various example compositions of substrate 102 being operable for use in semiconductor nanosheets 116. Sacrificial nanosheets 118, by contrast, can be composed of a different material relative to the composition of semiconductor nanosheets 116, e.g., one or more materials selected to facilitate replacement with different materials in subsequent processing. According to an example embodiment, sacrificial nanosheet(s) 118 can include silicon germanium (SiGe). In this case, sacrificial nanosheet(s) 118 can be replaced with one or more conductive materials in subsequent processing according to any currently known or later developed technique for providing a conductive nanosheet between semiconductor nanosheets 116, e.g., laterally etching and removing semiconductor material and filling replacing the semiconductor material with a conductive metal. In any case, each nanosheet 116, 118 may be structurally distinct from other elements described herein by having a significantly reduced thickness as compared to other transistor elements. In an example, each nanosheet 116, 118 in stack 114 can each have a thickness of, e.g., less than approximately 5.0 nanometers (nm).

Nanosheets 116, 118 can be formed on substantially the entire substrate 102 by performing multiple epitaxial growth processes to produce or define nanosheet stack 114. In this depicted example, the number and thickness of nanosheets in nanosheet stack 114 may vary depending upon the particular application. In the example depicted herein, the depicted nanosheet stack 114 includes three semiconductor nanosheets 118. However, in practice, the nanosheet stack 114 could be formed with any desired number of nanosheets including a single semiconductor nanosheet 116 and sacrificial nanosheet 118. Additionally, nanosheet stack 114 includes multiple second sacrificial nanosheets 118, each nanosheet 118 need not be formed to the same thickness, although that may be the case in some applications. Similarly, when nanosheet stack 114 includes multiple semiconductor nanosheets 116, each semiconductor nanosheet 116 within stack 114 need not be formed to the same thickness, although that may be the case in some applications.

Figure 2:
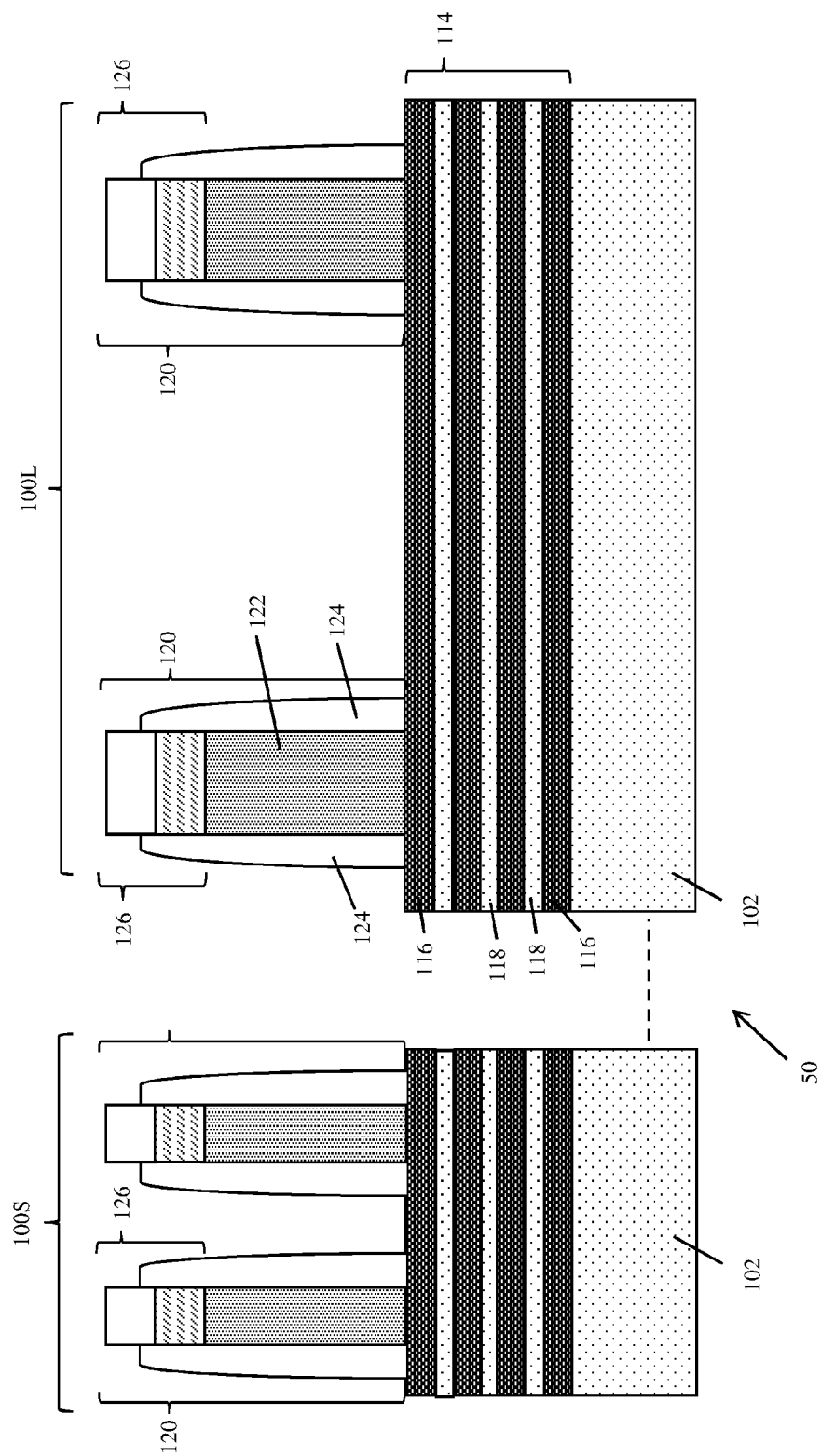
FIG. 2 shows a cross-sectional view of forming a set of gate structures on the nanosheet stacks for processing into a preliminary structure according to the disclosure.

Turning to FIG. 2, a set of gate structures (alternatively known as "dummy gates") 120 may be positioned directly on nanosheet stack 114. Each gate structure 120 can initially be formed on targeted regions of bulk nanosheet material to define the length of an individual transistor structure, and to provide sacrificial material for yielding targeted transistor structure in subsequent processing. In one embodiment, each gate structure 120 may include an upper semiconductor 122 composed of, e.g., amorphous silicon (a-Si). Each gate structure 120 can further include sidewall spacers 124 laterally abutting upper semiconductor region 122. Sidewall spacers 124 for gate structures 120 may be formed, e.g., by a combination of deposition and etching, over the initial structure of nanosheet stack 114 and laterally adjacent to upper semiconductor region 122. Sidewall spacers 126 may be comprised of a variety of different materials, such as silicon nitride, SiBCN, SiNC, SiN, SiCO, and SiNOC, etc., and they may each be made of the same or different materials. An upper mask (also known as a hardmask) 126 composed of one or more layers of insulative or masking materials is positioned on upper semiconductor region 122 to protect upper semiconductor region 122 and/or other underlying materials during subsequent processing of precursor structure 100. In particular, upper mask 126 can include, e.g., an insulator composed of a nitride or oxide material positioned beneath one or more layers of masking material, e.g., an a silicon nitride or silicon oxide hard mask (indicated with different cross hatching). According to an example, each gate structure 120 can have a height of between approximately fifty and approximately two-hundred nanometers (nm), and a length of between approximately fifteen nm and approximately two-hundred nm.

Figure 3:
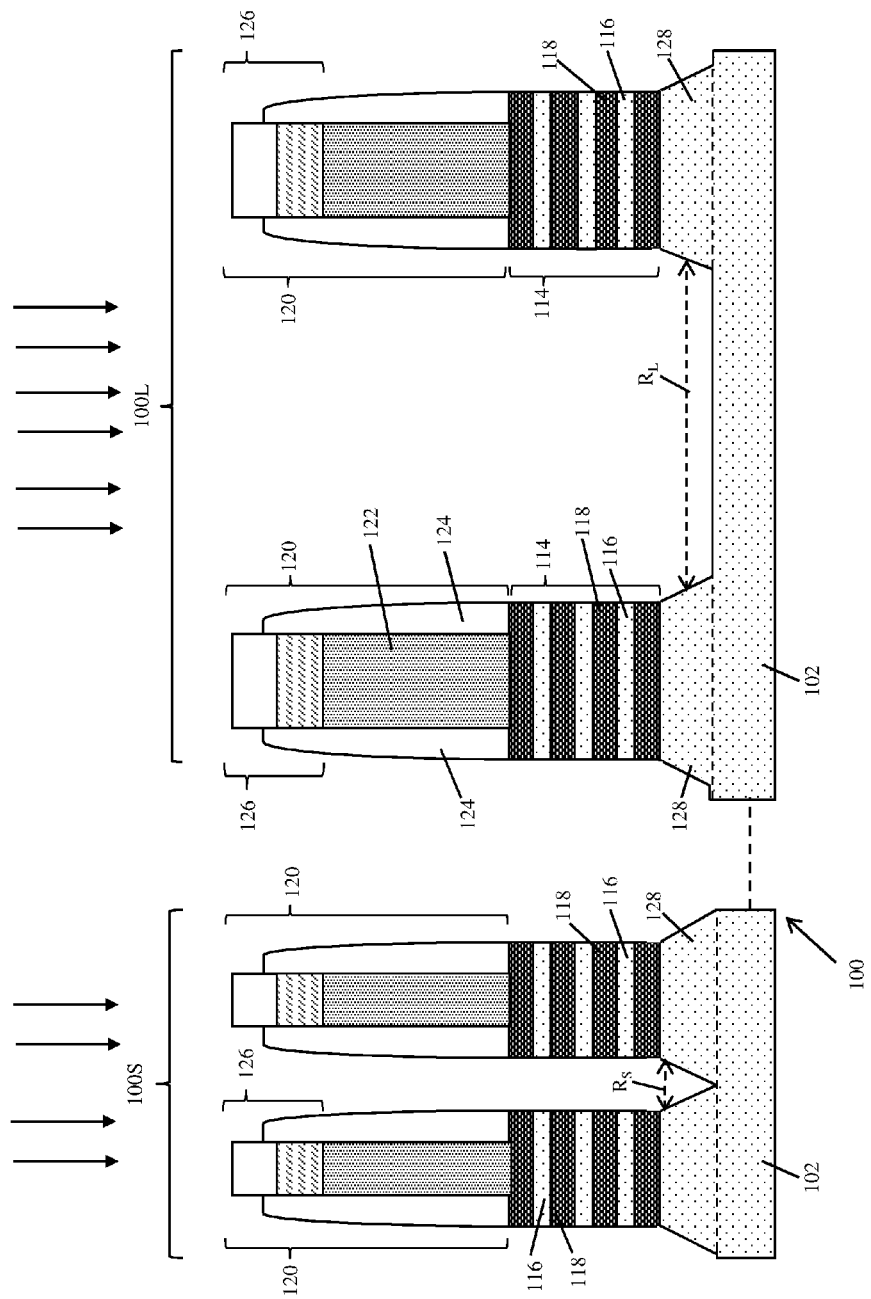
FIG. 3 shows a cross-sectional view of etching portions of the nanosheet stacks and substrate between the gate structures to form a precursor structure according to the disclosure.

Turning to FIG. 3, portions of nanosheet stack 114 not covered by gate structures 120 can be removed, e.g., by etching and/or other process for removing a material (indicated with downward-facing arrows), to form a plurality of nanosheet stacks 114 in short channel region 100S and long channel region 100L. Each nanosheet stack 114 can be formed to have a predetermined lengths and lateral separation distance between adjacent nanosheet stacks 114, e.g., based on the size of gate structures 120. Underlying portions of substrate 102 may also be removed during the forming of nanosheet stacks, e.g., to define transistor sites 128 underlying each nanosheet stack 114. Each transistor site 128 can be structurally continuous with substrate 102, and in some cases may protrude from an upper surface of substrate 102 after nanosheet stacks 114 have been formed. In other cases, transistor sites 128 can be defined simply as portions of substrate 102 beneath one nanosheet stacks 114. Thus, each of the plurality of nanosheet stacks 114 can be positioned on an upper surface of a corresponding transistor site 128.

Although short channel region 100S and long channel region 100L of precursor structure 100 can include similar or identical components of varying size, the relative position of each component therein can be different between each region. In short channel region 100S, a separation distance $R_S$ between gate structures 120 and transistor sites 128 of short channel region 100S can be substantially less than a separation distance $R_L$ in long channel region 100L. According to an example, separation distance $R_S$ between transistor sties 128 of short channel region 100S can be less than approximately twenty nm. By comparison, separation distance $R_L$ between transistor sites 128 of long channel region 100L can be greater than approximately two-hundred and fifty nanometers nm. The gate length of each gate structure 120 (e.g., lateral distance across gate structure 120 from sidewall-to-sidewall) can be less than approximately fifteen nm in short channel region 100S, while the length of gate structures 120 can be up to approximately two hundred nm in long channel region 100L.

Figure 4:
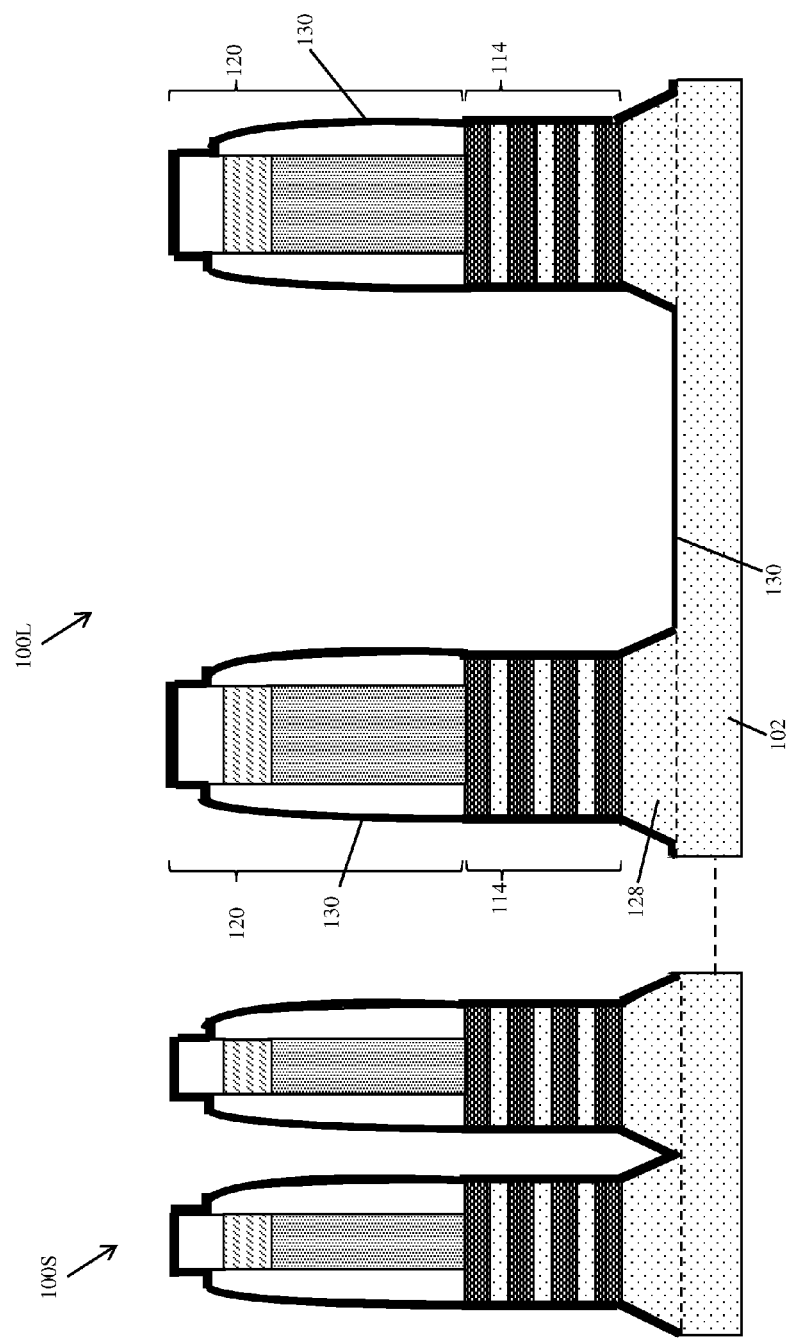
FIG. 4 shows a cross-sectional view of an encapsulation liner being formed conformally on exposed surfaces according to the disclosure.

Referring to FIG. 4, short channel region 100S and long channel region 100L of precursor structure 100 (FIG. 3) can be processed together to yield IC structures according to the present disclosure. In some cases, reference lines and numbers of short channel region 100S for components corresponding to those in long channel region 100L have been omitted from FIGS. 4-15 solely for clarity of illustration. Embodiments of the disclosure can include forming an encapsulation liner 130 conformally on exposed surfaces of substrate 102, transistor sites 128, nanosheet stacks 114, and gate structures 120 in each region 100S, 100L as shown. Encapsulation liner 130 can be composed of any currently known or later developed insulative material, e.g., an oxide, nitride, and/or other insulating material. Materials appropriate for the composition of encapsulation liner 130 may include, for example, silicon dioxide ($SiO_2$), silicon nitride (SiN), (SiCO), hafnium oxide ($HfO_2$), alumina ($Al_2O_3$), yttrium oxide ($Y_2O_3$), tantalum oxide ($Ta_2O_5$), titanium dioxide ($TiO_2$), praseodymium oxide ($Pr_2O_3$), zirconium oxide ($ZrO_2$), erbium oxide ($ErO_x$), other silicon and nitride-based materials (e.g., SiBCN, SiNC, SiNOC), organosilicon compounds, and other currently known or later-developed materials having similar properties.

Figure 5:
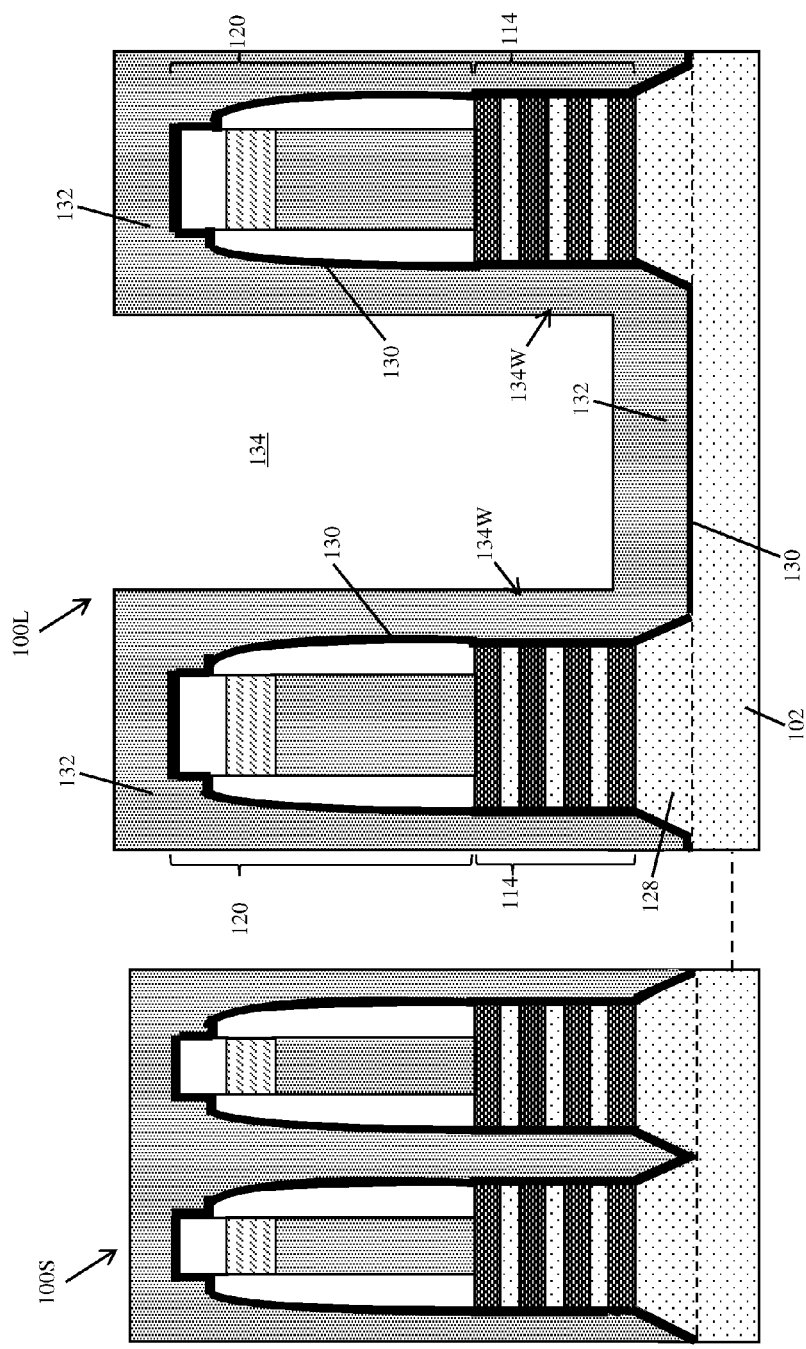
FIG. 5 shows a cross-sectional view of a sacrificial semiconductor layer deposited using a conformal process according to the disclosure.

Turning to FIG. 5, the disclosure can include targeting an area laterally between transistor sites 128 of long channel region 100L for masking in subsequent processes, e.g., by forming a sacrificial semiconductor layer 132 on encapsulation liner 130 via conformal deposition on exposed surfaces of encapsulation liner 130. The thickness of sacrificial semiconductor layer 132 can be approximately equal to $R_S$, i.e., the separation distance between gates in short channel region 100S, as a result of the conformal process for forming sacrificial semiconductor layer 132. Upon being formed, sacrificial semiconductor layer 132 can overlie substrate 102, transistor sites 128, nanosheet stacks 114, gate structures 120 and encapsulation liner 130 in long channel region 100L. Sacrificial semiconductor layer 132 can be composed of, e.g., amorphous silicon (a-Si) or may include a different semiconductor material that can be deposited conformally, e.g., silicon germanium (SiGe).

The conformal deposition of sacrificial semiconductor layer 132, and the greater separation distance in long channel region 100L, can define a recess 134 in sacrificial semiconductor layer 132 laterally between gate structures 120 and nanosheet stacks 114. Recess 134 may extend only partially into the depth of sacrificial semiconductor layer 132, such that a portion of sacrificial semiconductor layer 132 is positioned beneath recess 134 and above substrate 102. As shown, the lower surface of recess 134 can be substantially aligned with one or more nanosheets 116, 118 (FIG. 1) of laterally adjacent nanosheet stacks 114. Recess 134 can also include a pair of lateral sidewalls 134W laterally displaced from the sidewall surfaces of nanosheet stacks 114 and portions of encapsulation liner 130 formed thereon. Recess 134 thus can be shaped to form a sacrificial structure, positioned laterally between yet separated from transistor sites 128, nanosheet stacks 114, and gate structures 120, for protecting substrate 102 and encapsulation liner 130 from being affected by subsequent processing.

Figure 6:
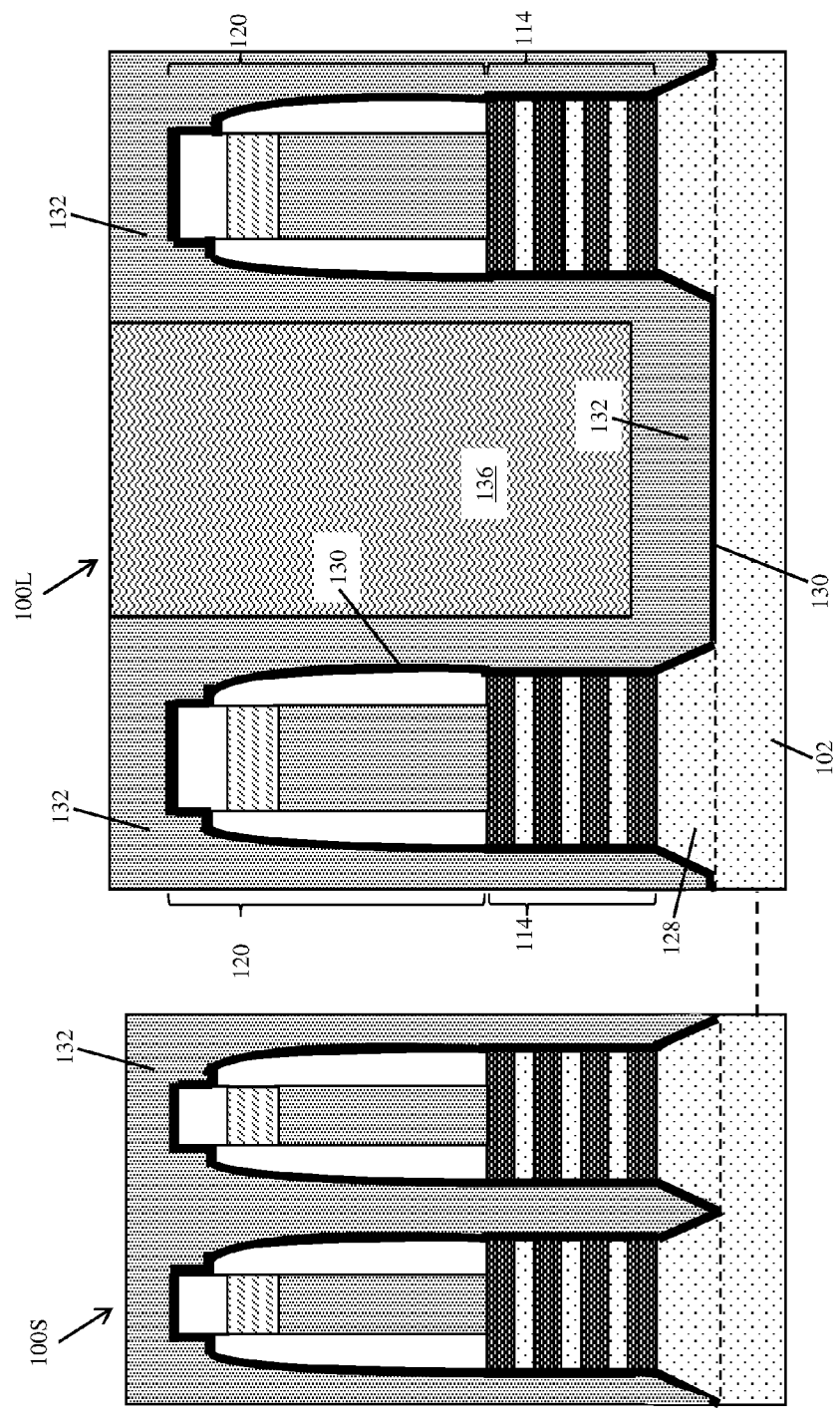
FIG. 6 shows a cross-sectional view of a masking layer being formed to yield a sacrificial structure according to embodiments of the disclosure.

Turning to FIG. 6, embodiments of the disclosure can include filling recess 134 (FIG. 5) with other materials for protecting underlying layers and/or components. As shown, the present disclosure can include forming a mask layer 136 within recess 134, such that mask layer 136 is positioned directly on a portion of sacrificial semiconductor layer 132 and above underlying portions of substrate 102 and encapsulation liner 130. Mask layer 136 can include one or more currently known or later developed substances configured to withstand lithographic processing of integrated circuit materials, e.g., an organic planarization layer (OPL), soft masking material, and/or other photoresist materials configured to protect underlying components. However embodied, mask layer 136 can fill recess 134 after being formed, e.g., by being deposited on sacrificial semiconductor layer 132, and then being planarized such that an upper surface of mask layer 136 is substantially coplanar with an upper surface of sacrificial semiconductor layer 132. After being formed and processed as discussed herein, mask layer 136 can be positioned laterally between transistor sites 128, nanosheet stacks 114, and gate structures 120 of long channel region 100L while remaining absent from short channel region 100S.

Figure 7:
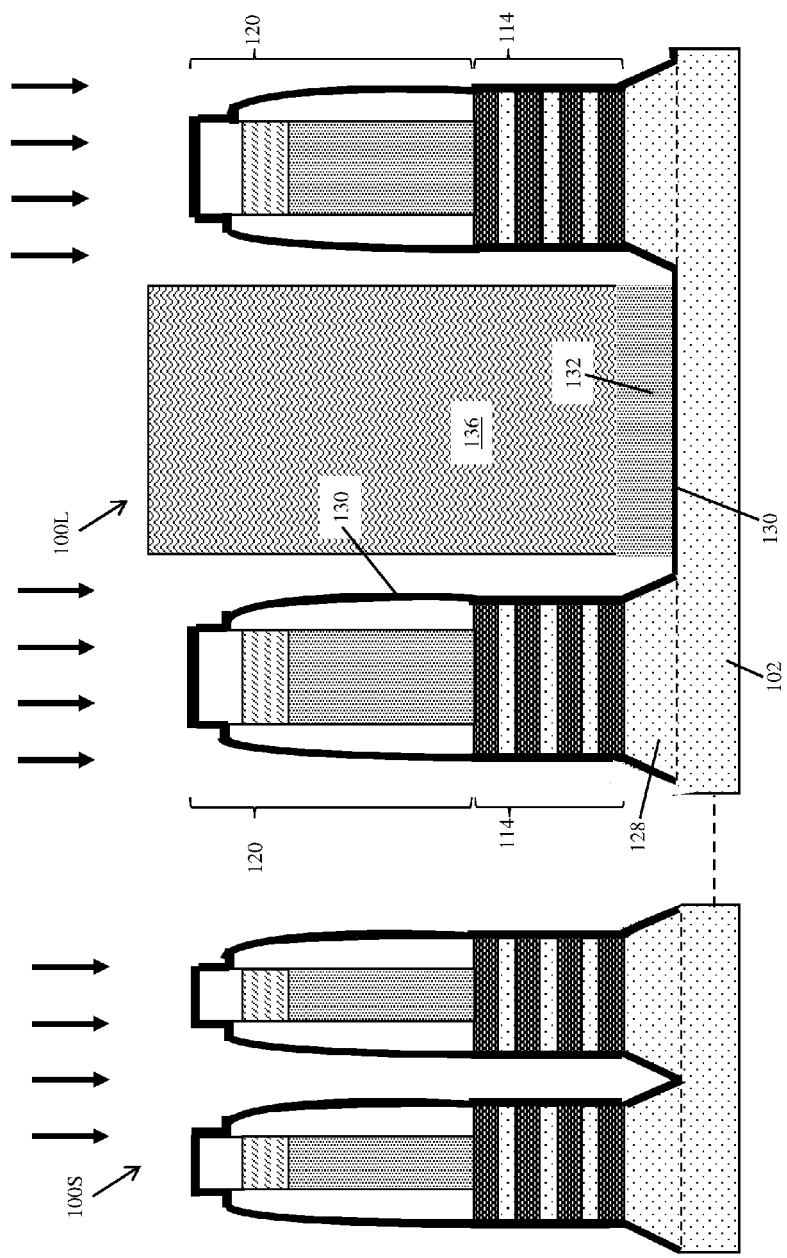
FIG. 7 shows a cross-sectional view of the sacrificial semiconductor layer being selectively etched according to embodiments of the disclosure.

Turning to FIG. 7, embodiments of the disclosure can include removing portions of sacrificial semiconductor layer 132 (FIGS. 2-5), leaving mask layer 136 and materials thereunder intact above substrate 102. Portions of sacrificial semiconductor layer 132 not covered by mask layer 136 can be removed pursuant to any currently known or later developed process of removing semiconductor material, e.g., selective etching. Etching generally refers to the removal of material (e.g., various structures formed above a substrate), and is often performed with a mask (e.g., mask layer 136) in place so that material may selectively be removed from certain areas of the substrate, while leaving the material unaffected in other areas of the substrate. An etching process is depicted symbolically in FIG. 6 with downward-oriented arrows. There are generally two categories of etching, (i) wet etch, and (ii) dry etch. Wet etch is performed with a solvent (such as an acid or a base) which may be chosen for its ability to selectively dissolve a given material (such as oxide), while, leaving another material (such as polysilicon or nitride) relatively intact. This ability to selectively etch given materials is fundamental to many semiconductor fabrication processes. A wet etch will generally etch a homogeneous material (e.g., nitride) isotopically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotopic. Ion milling, or sputter etching, bombards the wafer with energetic ions of noble gases that approach the wafer approximately from one direction, and therefore this process is highly anisotropic. Reactive-ion etching (RIE) operates under conditions intermediate between sputter and plasma etching and may be used to produce deep, narrow features, such as STI trenches. Etching materials and/or processes for removing semiconductor materials may remove sacrificial semiconductor layer 132 without affecting portions of encapsulation liner 130.

Figure 8:
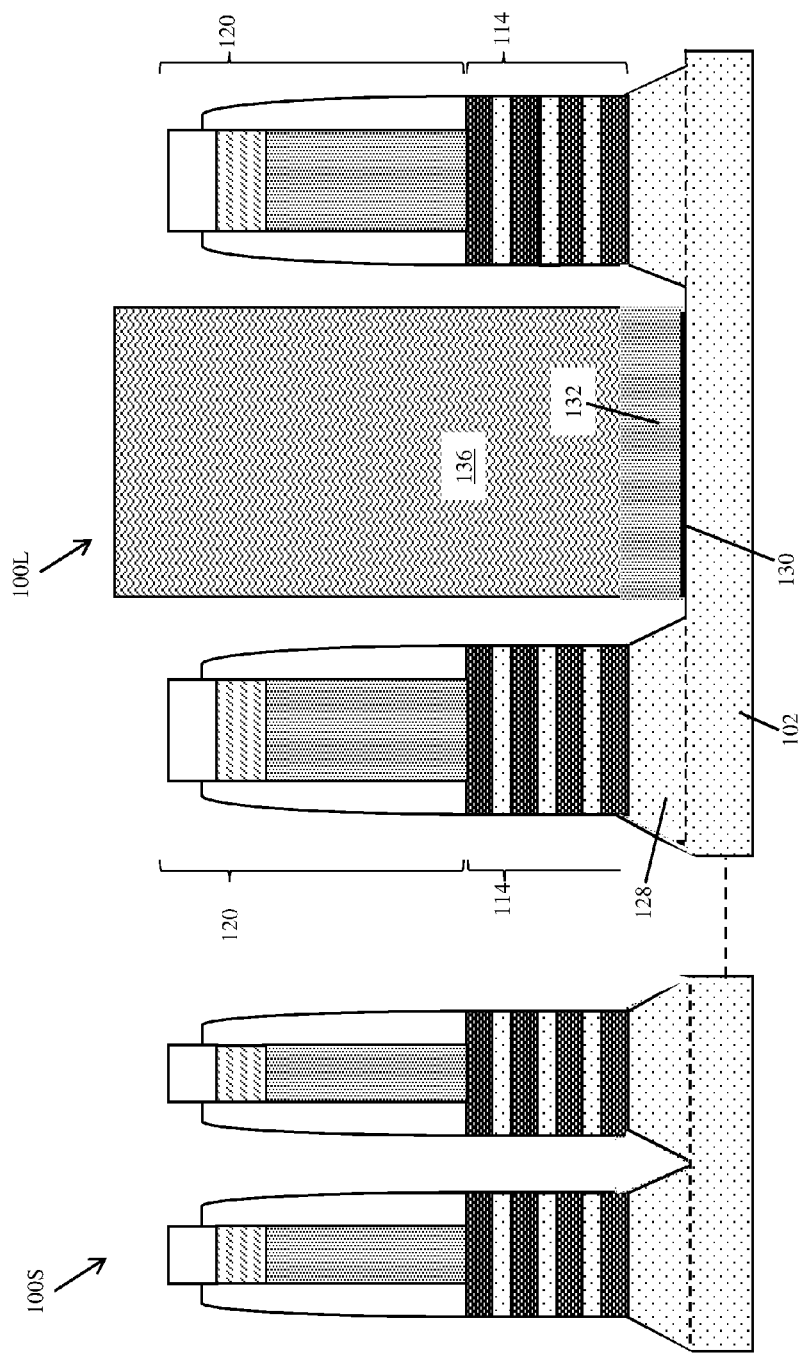
FIG. 8 shows a cross-sectional view of the encapsulation liner being removed according to embodiments of the disclosure.

Referring briefly to FIG. 8, further processing according to the disclosure can include further removal of encapsulation liner 130 (FIGS. 3-7), e.g., by way of an etchant selective to the material composition of encapsulation liner 130 without affecting mask layer 136. In cases where encapsulation liner 130 includes a semiconductor material, continued selective etching of exposed surfaces can remove encapsulation liner 130 completely from short channel region 100S, while leaving only a portion of encapsulation liner 130 intact beneath mask layer 136 in long channel region 100L.

Figure 9:
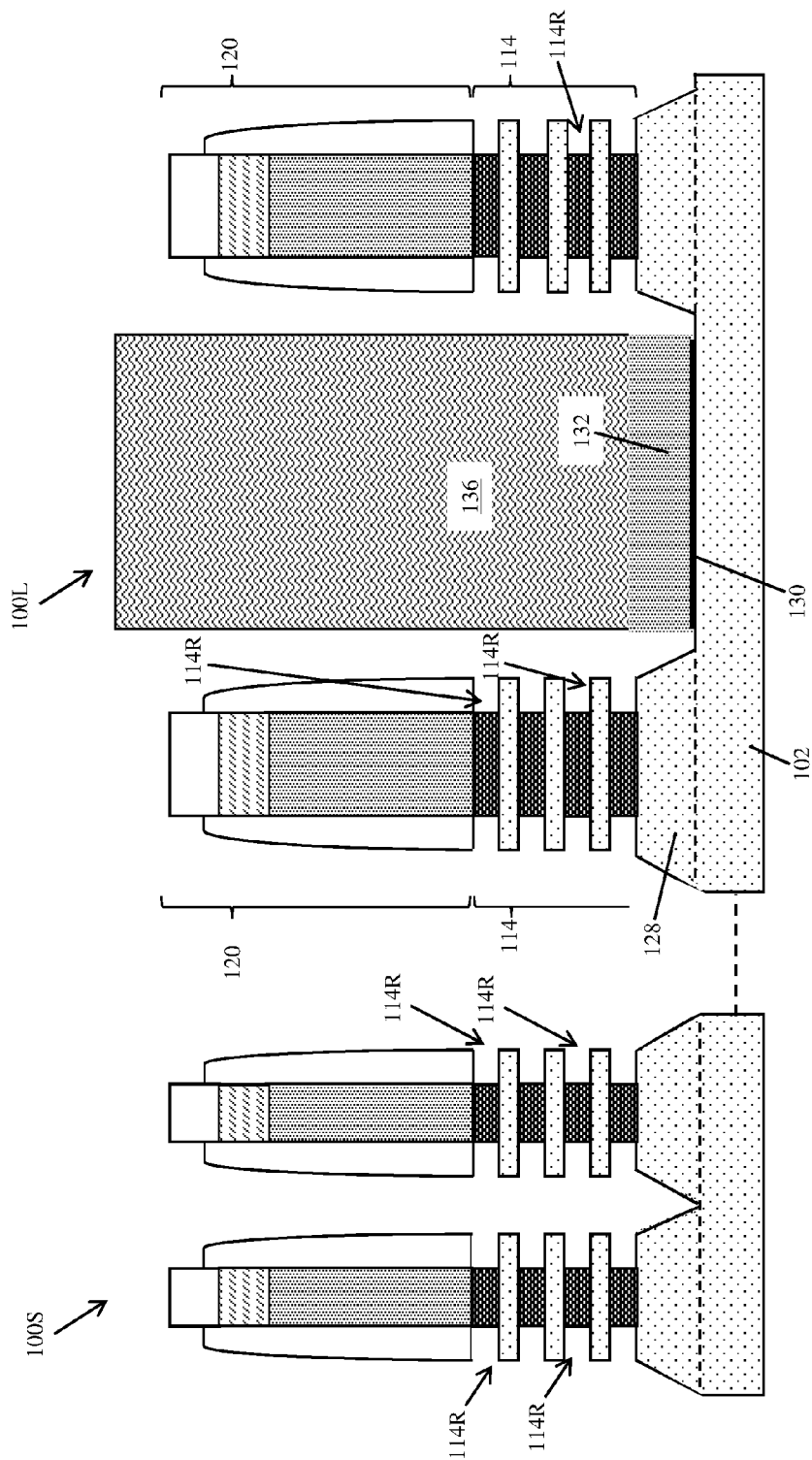
FIG. 9 shows a process of selective indentation of alternating nanosheets to form inner spacer recesses according to embodiments of the disclosure.

Turning to FIG. 9, Removing sacrificial semiconductor layer 132 and encapsulation liner 130 can expose lateral sidewalls of each nanosheet stack 114 above transistor sites 128. To prepare nanosheet stacks 114 for subsequent gate formation, further processing according to the disclosure can include laterally recessing alternating nanosheets (e.g., sacrificial nanosheets 118 (FIG. 1)) to yield a plurality of recesses 114R in each nanosheet stack 114. The lateral recessing of alternating nanosheets can be provided, e.g., by application of a wet etchant selective to the composition of sacrificial nanosheets 118 (e.g., SiGe or similar crystalline semiconductors), and which leaves other structures (e.g., substrate 102, transistor sites 128, mask layer 136, etc.) substantially intact. Additional insulating materials, e.g., inner spacers, can subsequently be formed in recesses 114 as discussed elsewhere herein.

Figure 10:
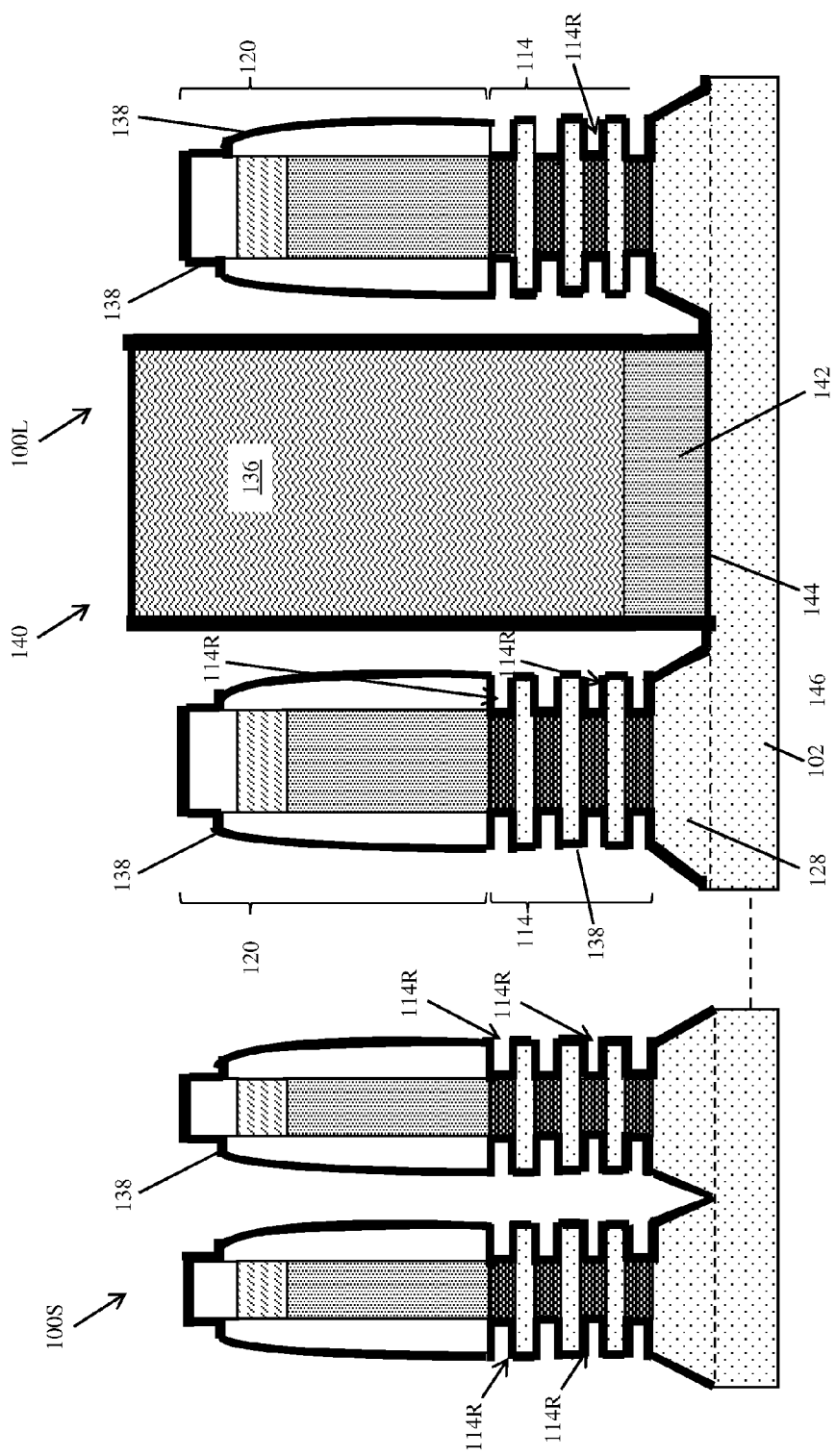
FIG. 10 shows a cross-sectional view of a thin insulative liner being formed conformally on exposed surfaces according to embodiments of the disclosure.

Referring now to FIG. 10, additional insulating material can be provided on nanosheet stacks 114 after recesses 114R have been formed. For example, an insulative coating 138 including, e.g., one or more insulative oxides and/or other electrically insulative materials described herein can be formed to coat the exposed recesses 114R in each nanosheet stack 114. Insulative coating 138 can thereby provide additional electrical insulation of other components formed in contact with nanosheet stacks 114. The processes discussed herein can yield a sacrificial structure 140 in long channel region 100L. A remaining portion of sacrificial semiconductor layer 132, covered by mask layer 136 and not previously removed, can remain intact beneath mask layer 136 as a semiconductor mandrel 142. The upper surface of mask layer 136 of sacrificial structure 140 can be positioned above an upper surface of gate structures 120 in long channel region 100L, as shown. Although portions of sacrificial structure 140 may eventually be removed from long channel region 100L in subsequent processing, the position and shape of sacrificial structure 140 in long channel region 100L can permit consistent formation of additional materials adjacent to transistor sites 128 in each region 100S, 100L.

Figure 11:
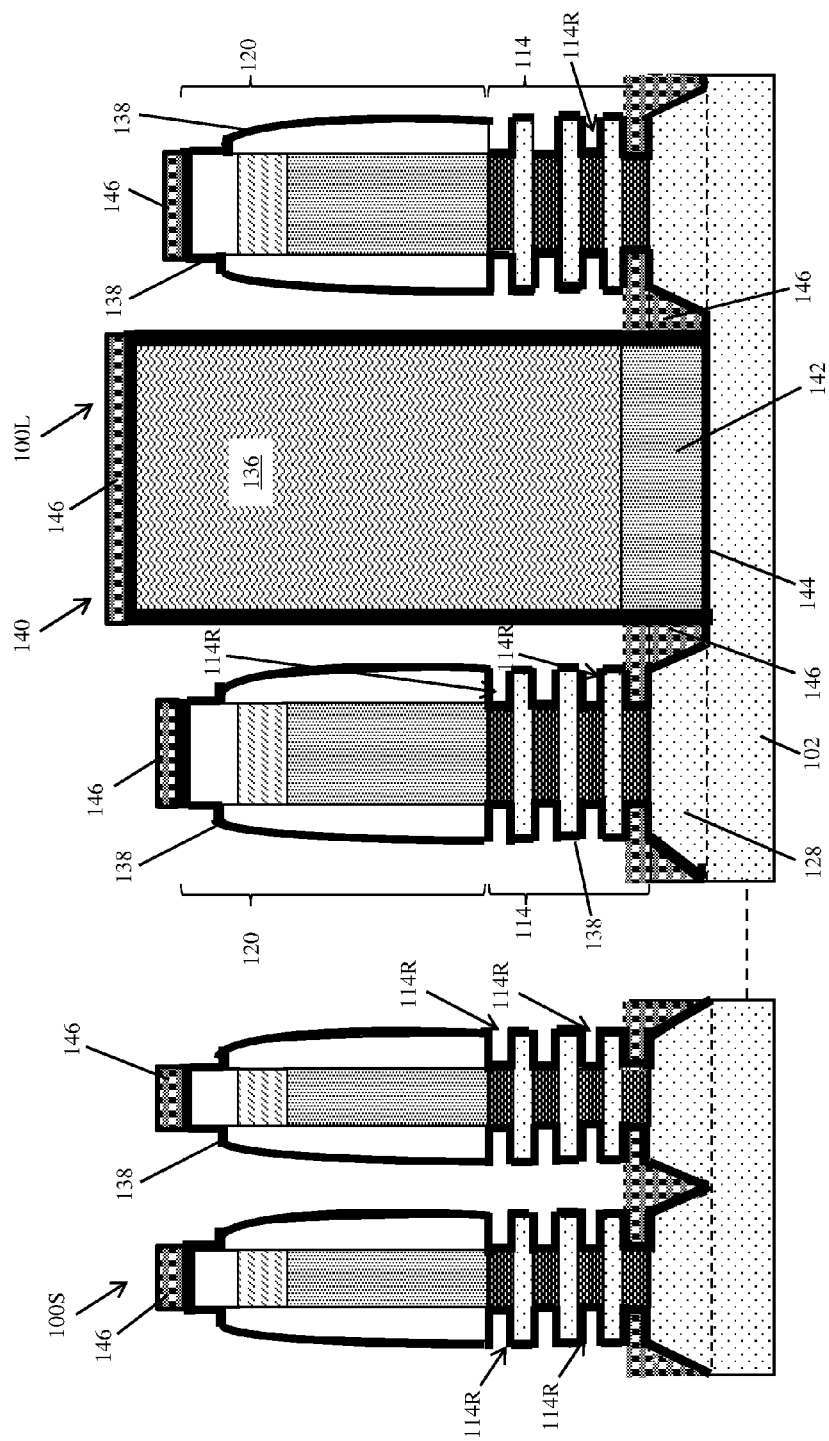
FIG. 11 shows a cross-sectional view of an insulative region being formed by anisotropic deposition of a dielectric material onto the insulative liner according to embodiments of the disclosure.

Referring to FIG. 11, embodiments of the disclosure can include forming insulative regions 146 in each region 100S, 100L of the processed structure. Each insulative region 146 in long channel region 100L can be positioned laterally between a sidewall of sacrificial structure 140 and one corresponding transistor site 128. The resulting structure of sacrificial structure 140 allows insulative regions 146 to be formed in pairs proximate respective transistor sites 128. Due to the reduced separation distance between transistor sites 128 in short channel region 100S, insulative regions 146 can be formed in short channel region 100S without sacrificial structure 140 being present therein. In addition to being formed on transistor sites 128 of each region, insulative regions 146 may also be formed initially on upper surfaces of mask layer 136 and each gate structure, as shown. Insulative regions 146 on nanosheet stacks 114 and mask layer 136 can be removed later without affecting insulative regions formed on transistor sites 128, as noted elsewhere herein The separation distance between transistor sites 128 of long channel region 100L and an adjacent sidewall of sacrificial structure 140 may be designed to be approximately equal to a separation distance between transistor sites 128 within short channel region 100S, e.g., up to approximately twenty nm. Insulative regions 146 can be formed by an anisotropic high density plasma (HDP) deposition of an insulating material (e.g., $SiO_2$ or other electrically insulating materials described herein) on other insulative materials, e.g., at least on insulative coating 138 between transistor sites 128 and semiconductor mandrel 142, and/or on exposed surfaces of nanosheet stacks 114 and mask layer 136. Where desired or applicable, portions of insulative material can be removed from nanosheet stacks 114 and mask layer 136, or alternatively may be left intact to form part of nanosheet stacks 114 and/or mask layer 136. Between each transistor site 128, an upper surface of insulative region 146 can exhibit a height above substrate 102 substantially equal to, or greater than, an upper surface of semiconductor mandrel 142.

Figure 12:
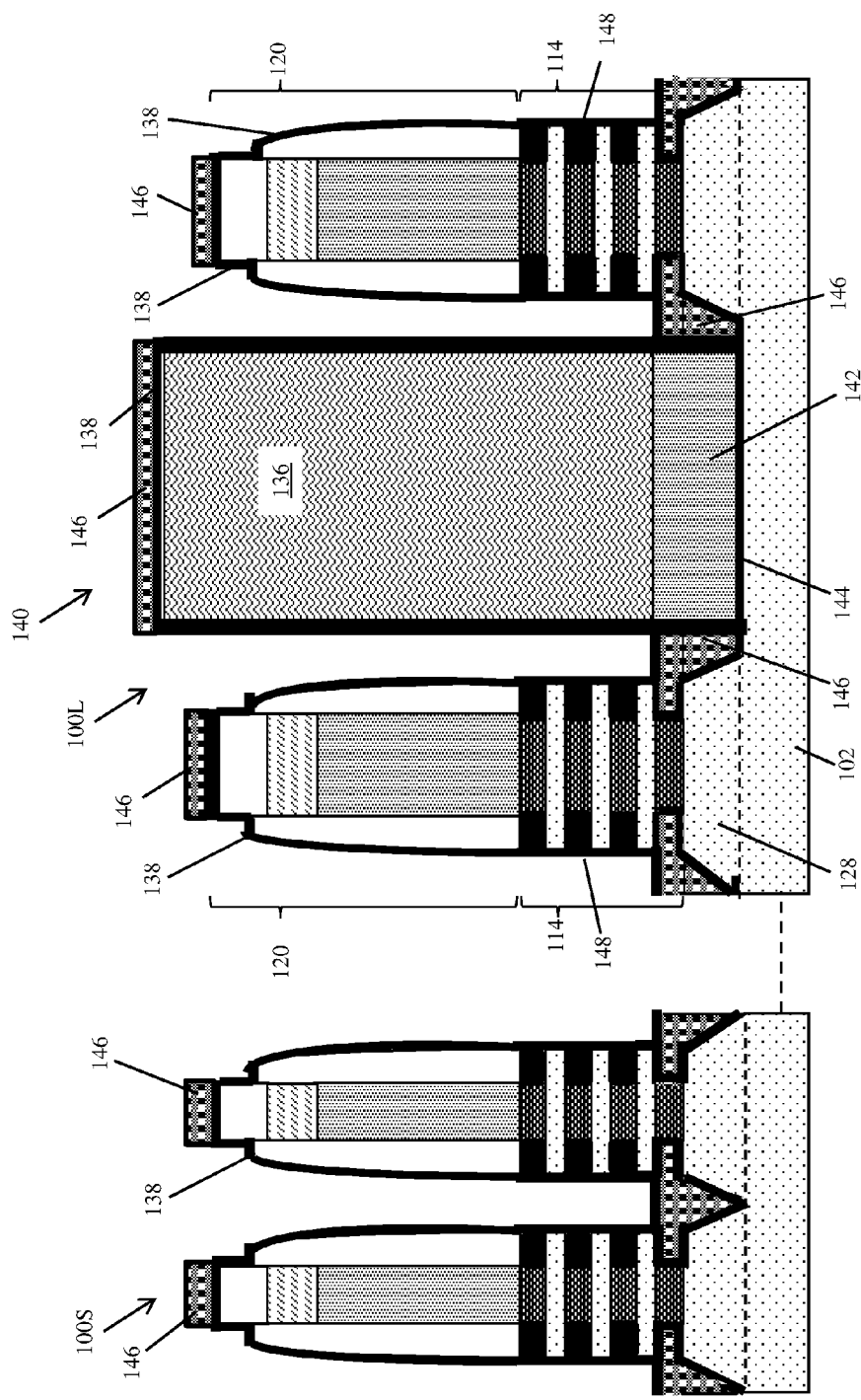
FIG. 12 shows a cross-sectional view of thin insulative liner being formed conformally on exposed surfaces to pinch-off the inner spacer recesses according to embodiments of the disclosure.

Proceeding to FIG. 12, embodiments of the disclosure can include forming an additional insulative coating 138 on masking layer 136 and insulative region 146, in addition to exposed surfaces of nanosheet stack 114 and gate structure 120 where insulative coating 138 had previously been formed. The additional insulative coating 138 can include, e.g., a nitride liner and/or insulative material which "pinches off" recesses 114R (FIG. 8) upon being formed to yield an inner spacer 148 positioned between alternating nanosheets in nanosheet stack 114. Inner spacer 148 can be positioned laterally adjacent to sacrificial nanosheets 118 (FIG. 1) of each nanosheet stack 114, and vertically between semiconductor nanosheets 116 (FIG. 1) of each nanosheet stack 114. As shown, portions of insulative coating 138 may also be formed on mask layer 136 and insulative region 146.

Figure 13:
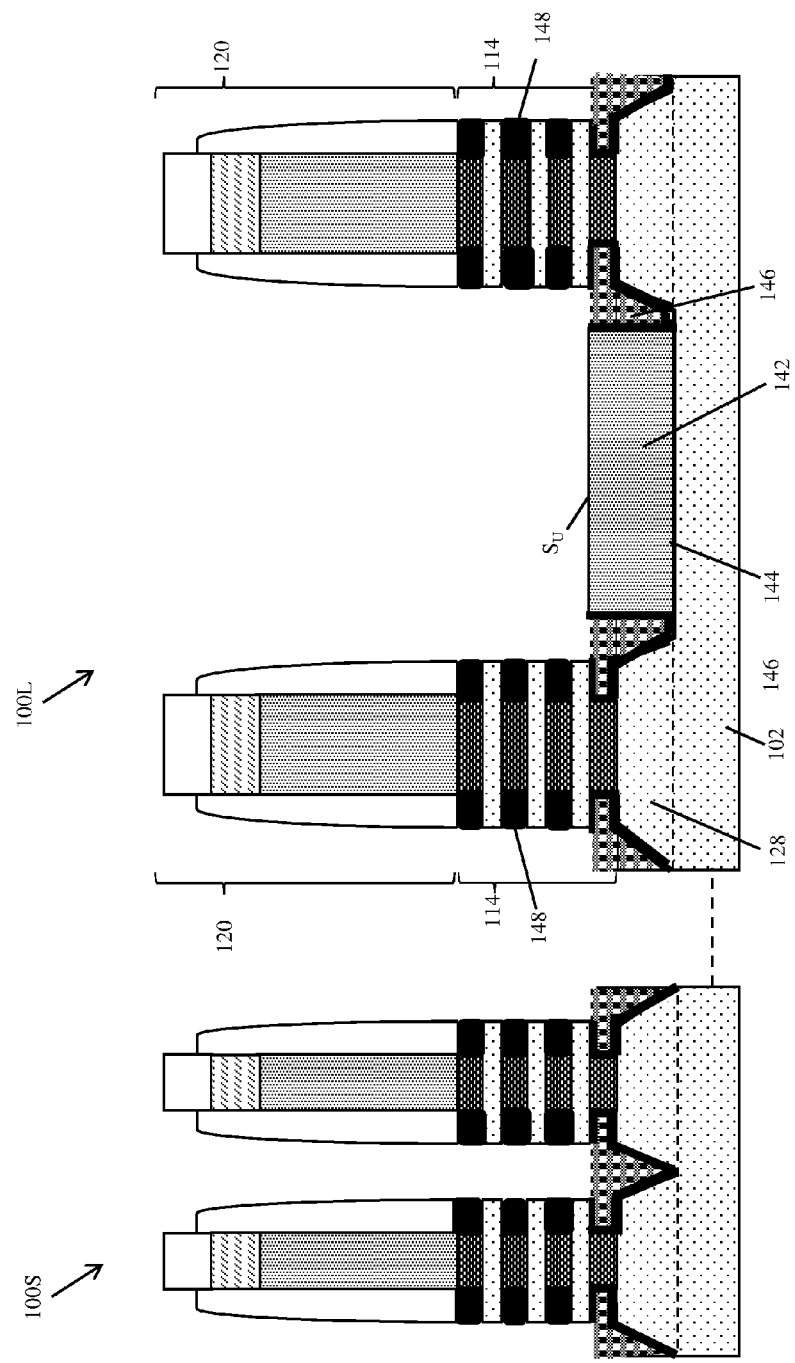
FIG. 13 shows a process of recessing the insulative liners to form inner spacers, and exposing the semiconductor mandrel according to embodiments of the disclosure.

Referring now to FIG. 13, portions of sacrificial structure 140 (FIGS. 10-12) and insulative coating 138 can be removed to prepare nanosheet stacks 114 and semiconductor mandrel 142 for subsequent processing. As discussed elsewhere herein, the position and size of sacrificial structure 140 can allow insulative regions 146 to be formed within similarly spaces adjacent to transistor sites 128 of short channel region 100S and long channel region 100L. To form the components of a gate for a nanosheet transistor, the various insulative components of sacrificial structure 140 can be removed from long channel region 100L. Exposed portions of insulative coating 138 which do not form portions of inner spacers 148 can be removed, e.g., by a non-selective etchant for removing exposed electrically insulative materials. The removing of such materials can additionally remove, e.g., insulative regions 146 previously formed on the upper surface of nanosheet stacks 114. Due to the presence of inner spacers 148 between alternating nanosheets, inner spacers 148 may remain substantially intact after insulative coating 138 is removed. In addition, portions of insulative liner 144 positioned beneath semiconductor mandrel 142 can be protected from removal and thus also may remain intact.

In addition to removing exposed portions of insulative coating 138, embodiments of the disclosure can also include removing mask layer 136 to expose an upper surface Su of semiconductor mandrel 142 thereunder. Any remaining insulative regions 146 can be removed with mask layer 136, e.g., by such remaining portions being removed along with mask layer 136 in the same process. Processes for removing mask layer 136 can include, e.g., a selective etch of OPL substances and/or similar materials of mask layer 136 without substantially affecting other materials on substrate 102. According to a more specific example, removing mask layer 136 can include forming an additional amount of OPL or similar masking material to increase the size of mask layer 136, thereby covering transistor sites 128, nanosheet stacks 114, and gate structures 120. The expanded OPL can then be stripped away to expose upper surface Su of semiconductor mandrel 142, and other materials previously covered by mask layer 136.

Figure 14:
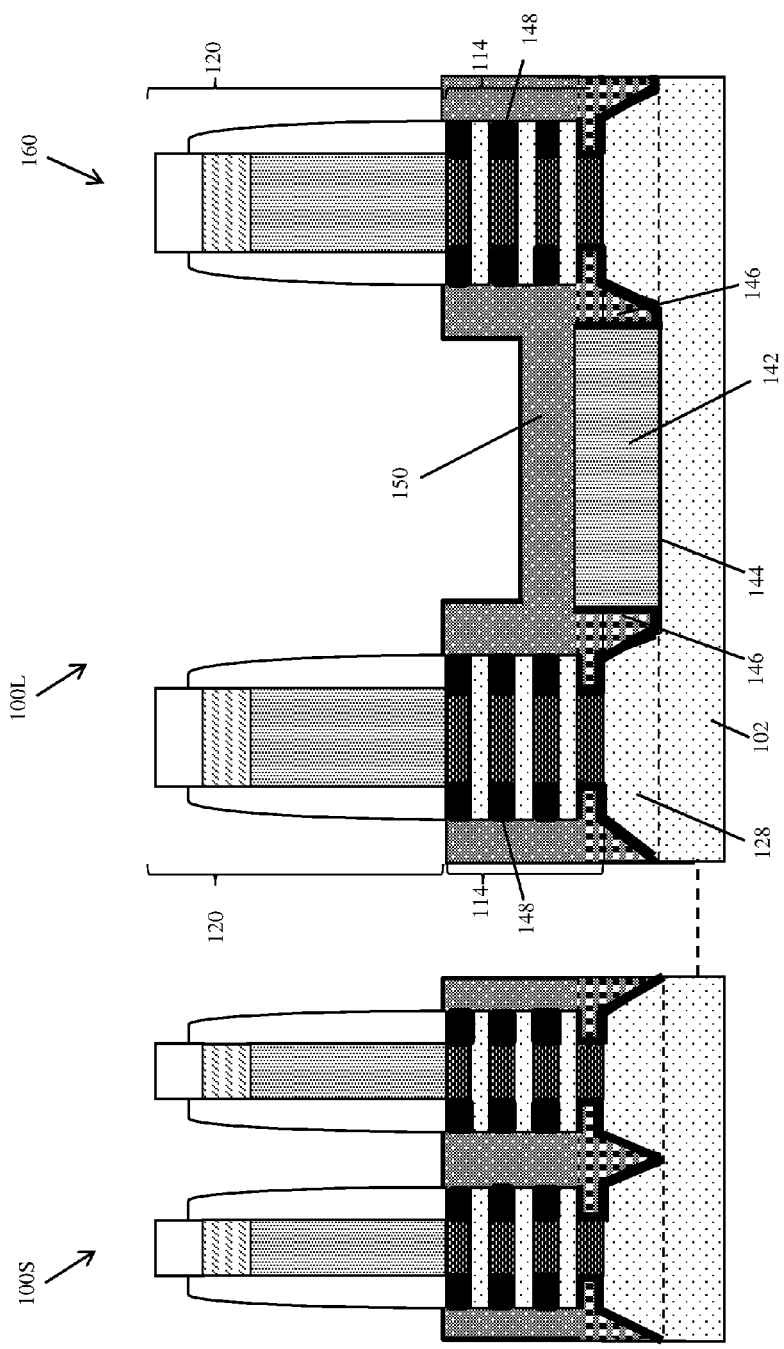
FIG. 14 shows a cross-sectional view of epitaxially growing a source/drain epitaxial region according to embodiments of the disclosure.

Turning to FIG. 14, embodiments of the disclosure can include epitaxially growing a source/drain epitaxial region 150 between respective pairs of nanosheet stacks 114, e.g., from exposed sidewalls of semiconductor nanosheets 116 (FIGS. 1-3) and upper surface Su (FIG. 13) of semiconductor mandrel 142. The terms "epitaxial growth and/or deposition" and "epitaxially formed and/or grown" mean the growth of a semiconductor material on a deposition surface of a semiconductor material, also known as a "seed layer," in which the semiconductor material being grown may have the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material may have the same crystalline characteristics as the deposition surface on which it may be formed. For example, an epitaxial semiconductor material deposited on a {100} crystal surface may take on a {100} orientation. In some embodiments, epitaxial growth and/or deposition processes may be selective to forming on semiconductor surfaces, and may not deposit material on dielectric surfaces, such as silicon dioxide or silicon nitride surfaces (e.g., nanosheet stacks 114, insulative regions 146, inner spacers 148). Although semiconductor mandrel 142 may include amorphous silicon, source/drain epitaxial region 150 may include, e.g., crystalline silicon as a result of being formed from a seed layer having a different semiconductor material or composition from semiconductor mandrel 142 and/or semiconductor materials of nanosheet stack 114.

Source/drain epitaxial region 150 may form part of an electrical connection to nanosheet stacks 114, e.g., to electrically connect to a channel region of a nanosheet transistor. Source/drain epitaxial regions 150 can be formed together in short channel region 100S and long channel region 100L above substrate 102, e.g., as a result of forming semiconductor mandrel 142 and insulative region 146 through other processes described herein. After being formed, source/drain epitaxial regions 150 in long channel region 100L can each be positioned between respective pairs of transistor sites 128 and over insulative region 146. Insulative liner 144 can electrically separate semiconductor mandrel 142 and source/drain epitaxial region 150 from substrate 102 in each region 100S, 100L as discussed elsewhere herein. Due to the relative positions of each nanosheet stack 114 and semiconductor mandrel 142, source/drain epitaxial region 150 in long channel region 100L may take on a substantial U-shape or other stepped geometry upon being formed. Forming source/drain epitaxial region 150 in each region 100S, 100L can thereby yield an IC structure 160 according to embodiments of the disclosure.

Figure 15:
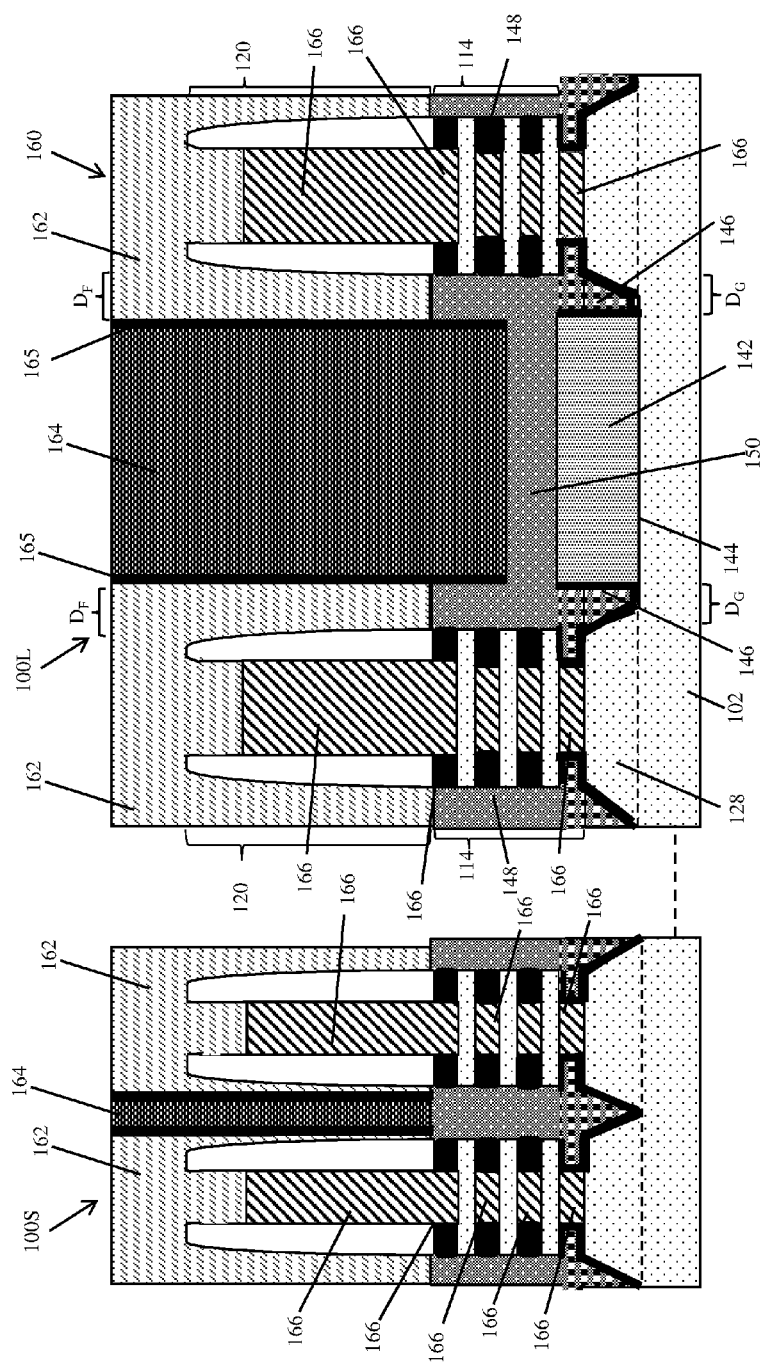
FIG. 15 shows a cross-sectional view of the formed IC structure after the first level of metal contact on source/drain epitaxial regions by embodiments of the disclosure.

Referring to FIG. 15, embodiments of the disclosure can further include forming additional components on IC structure 160 to define gate and terminal contacts to a nanosheet transistor. Specifically, after source/drain epitaxial region 150 is formed in each region 100S, 100L, further processing can include forming an insulator 162 (e.g., by deposition) on each gate structure 120 and source/drain epitaxial region 150 in short channel region 100S and long channel region 100L. The composition of insulator 162 can include any currently known or later developed insulative material, e.g., one or more insulators included within gate structure 120 and/or insulative regions 146 described elsewhere herein.

After insulator 162 is formed to cover nanosheet stacks 114 and source/drain epitaxial region 150, further processing according to the disclosure can include removing a targeted portion of insulator 162, e.g., between nanosheet stacks 114 and over source/drain epitaxial region 150, to provide an electrical connection to a transistor gate terminal. Embodiments of the disclosure therefore can include forming one or more openings within insulator 162 to be filled with a trench silicide 164. The remaining portions of insulator 162 over nanosheet stacks 114 can define a set of insulative caps each positioned on respective nanosheet stacks 114 and portions of source/drain epitaxial region 150. Trench silicide 164 can be formed within openings of insulator 162 to extend from source/drain epitaxial region 150 to an upper surface of insulator 162. Silicide generally refers to one or more alloys of silicon and metal produced to form a conductive contact to a semiconductor material. Example silicide compounds can include, e.g., titanium silicide ($TiSi_2$), cobalt silicide ($CoSi_2$), nickel silicide (NiSi), and/or other compounds or alloys which include a semiconductor material (e.g., silicon) and one or more conductive metals. In the case of trench silicide 164, the semiconductor particles therein can be provided at least partially by source/drain epitaxial region 150 thereunder. In addition to trench silicide 164, embodiments of the disclosure can include forming protective liners 165 on opposing sidewall surfaces of insulator 162. Protective liners 165 can be composed at least partially from one or more conductive metals such as, e.g., one or more silicide materials included in trench silicide 164. Protective liners 165 can include, e.g., cobalt silicide and/or one or more materials formed from refractory metals to electrically separate trench silicide 164 from insulator 162.

IC structure 160 according to the present disclosure can include one or more of the various structures formed according to processes outlined herein. IC structure 160 can include short channel regions 100S and long channel regions 100L on a single substrate, each of which may include substrate 102 and pairs of transistor sites 128 positioned thereon. An upper surface of substrate 102 laterally between transistor sites 128 can define a separation region ($R_S$, $R_L$ (FIG. 1)) between respective pairs of transistor sites 128. Pairs of nanosheet stacks 114 can correspondingly be positioned on one transistor site 128 of a pair. Insulative liner 144 can be positioned on substrate 102 between transistor sites 128, with semiconductor mandrel 142 being positioned thereon solely within long channel region 100L. Pairs of insulator regions 146 can be positioned laterally between semiconductor mandrel 142 and sidewall surfaces of laterally adjacent transistor sites 128. Source/drain epitaxial region 150 can be positioned over each insulator region 146 and semiconductor mandrel 142, such that semiconductor region 150 laterally abuts a corresponding pair of nanosheet stacks 114. Except for the presence of semiconductor mandrel 142 and the relative differences in size, IC structure 160 may include substantially the same components in short channel region 100S and long channel region 100L. Each transistor site 128 and nanosheet stack 114 of IC structure 160 can include gate structure 120 thereon, in addition to insulator 162 thereover. Trench silicide 162 can be positioned directly on source/drain epitaxial region 150 to define an electrical connection thereto, and directly between a respective of nanosheet stacks 114 and portions of insulator 162.

As a result of forming sacrificial structure 140 (FIGS. 10-12) in earlier processes, the lateral width $D_F$ of insulator 162 between each gate structure 120 and trench silicide 164 and/or protective liner 165 in long channel region 100L can be approximately equal to a lateral width $D_G$ of each insulative region 146 between each transistor site 128 and semiconductor mandrel 142. During operation, a voltage can be applied to nanosheet stacks 114 through trench silicide 164, which may be permitted to flow through portions of nanosheet stack 114 during operation of a device as discussed herein/

Figure 16:
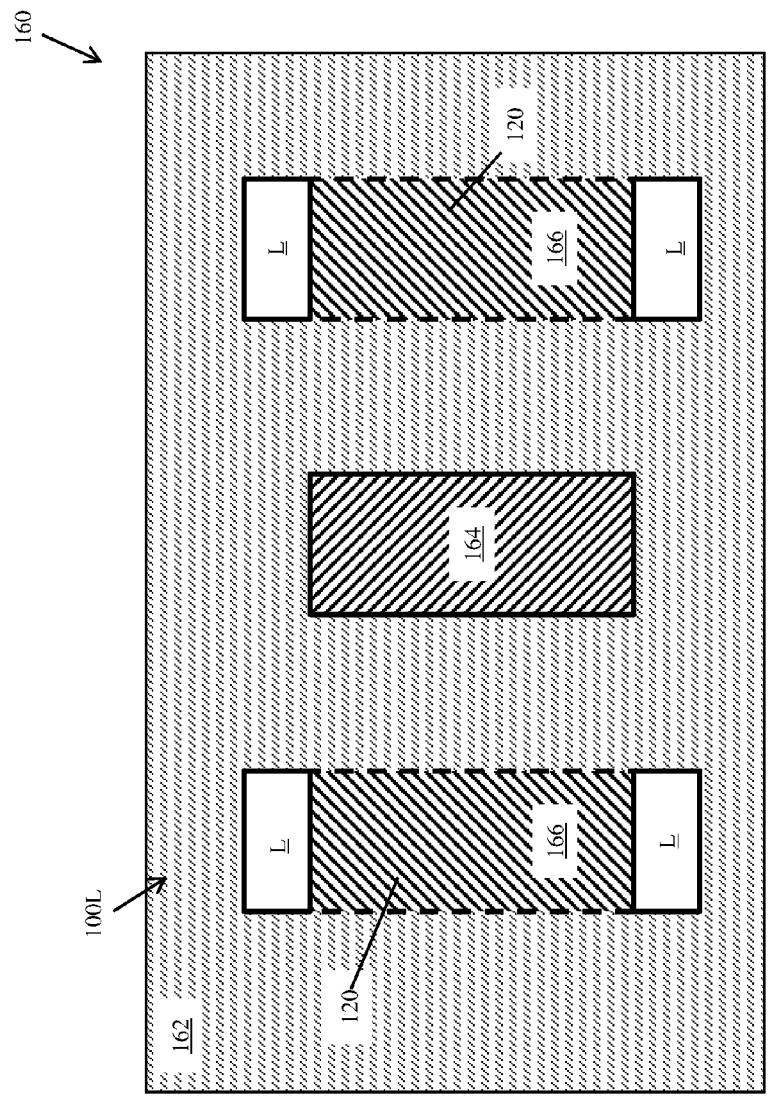
FIG. 16 shows a plan view of forming a work function metal for an IC structure according to embodiments of the disclosure.

Referring to FIG. 15 (cross-sectional view) and 16 (plan view, long channel region 100L only) together, processes according to the disclosure can also include replacing sacrificial nanosheets 118 (FIG. 1) and/or upper semiconductor regions 122 (FIG. 1) with a high work function metal 166 (simply "work function metal" hereafter, e.g., cobalt (Co), beryllium (Be), gold (Au), etc.) to provide electrical conductivity through IC structure 160. Work function metal 166 is shown in phantom in FIG. 16 to illustrate that it is positioned beneath insulator 162. According to an embodiment, IC structure 160 may extend, e.g., laterally into and out of the plane of the page in FIG. 15 to electrically connect respective source/drain terminals on opposing ends. Work function metal 166 is also depicted with a different cross-hatching from trench silicide 164 to emphasize differences in material composition. To replace the semiconductor material of sacrificial nanosheets 118 and/or upper semiconductor regions 122 with conductive materials, sacrificial nanosheets 118 and upper semiconductor regions 122 can be replaced with work function metal 166 and/or similar conductive materials according to any currently known or later developed process for replacing sacrificial semiconductor materials with conductive materials. According to an example process, openings L (shown in FIG. 15 only) can be formed adjacent to opposing lateral ends of nanosheet stacks 114 and gate structures 120 to expose sidewall surfaces of nanosheet stacks 114 and gate structures 120. Sacrificial nanosheets 118 and/or upper semiconductor regions 122 can then be selectively removed, e.g., by applying a wet etchant or other material to selectively remove SiGe, amorphous silicon, and/or other materials included in sacrificial nanosheets 118 and/or upper semiconductor regions 122 while leaving other portions of nanosheet stacks 114 and gate structures 120 intact. Work function metal 166 can then be formed, e.g., by deposition to fill the spaces from which sacrificial nanosheets 118 and upper semiconductor regions 122 have been removed. It is understood that work function metal 166 can alternatively be formed within and/or in contact with nanosheet stacks 114 according to other processes currently known or later developed.

Figure 17:
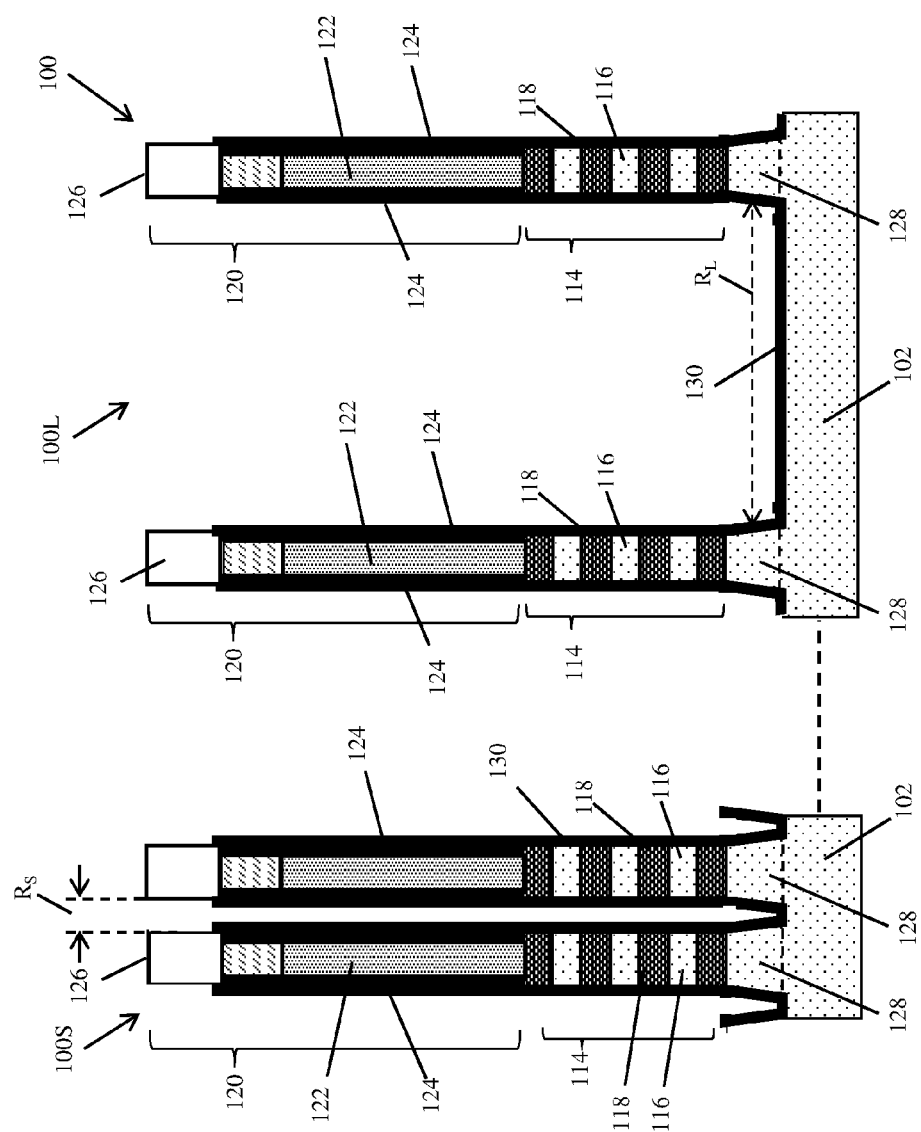
FIG. 17 shows a cross-sectional view of forming an encapsulation liner being formed conformally on consecutive gates according to embodiments of the disclosure.

Turning to FIG. 17, further embodiments of the disclosure can include further applications of the various processes and materials described herein to yield varying IC structures, e.g., for use in differently shaped nanosheet transistors. The various processes described elsewhere herein relative to FIGS. 1-16 thus may be applied to other embodiments or implementations described herein, where applicable, and vice versa. Any differences in size, scale, etc., of elements in FIGS. 17-25 as compared to FIGS. 1-16 is solely for clarity of illustration relative to the processes discussed herein.

As noted herein, precursor structure 100 can be formed by the various initial processing steps noted herein relative to FIGS. 1-13. Precursor structure 100 to be processed according to the disclosure can include substrate 102 composed of one or more semiconductor materials, in addition to multiple pairs of transistor sites 128 each positioned in short channel region 100S and long channel region 100L. Each fin can include a nanosheet stack 114 thereon with an alternating series of semiconductor nanosheets 116 and sacrificial nanosheets 118. Other than differences in separation distance $R_S$, $R_L$ between transistor sites 128 in each region 100S, 100L, the structure of transistor sites 128, nanosheet stacks 114, and gate structures 120 may otherwise be substantially identical in each region 100S, 100L. Processes according to the disclosure can include forming transistor sites 128 in addition to nanosheet stacks 114 and gate structures 120 according to any currently known or later developed process for forming such structures on or from substrate 102, e.g., one or more fabrication techniques described herein with respect to elements shown in FIG. 1.

As noted herein, each gate structure 120 can include a corresponding set of distinct elements. For instance, gate structure 120 may include upper semiconductor region 122 composed of one of the example materials noted herein, e.g., amorphous silicon (a-Si), optionally with a thin silicon dioxide ($SiO_2$) layer (not shown) or other gate dielectric material vertically separating upper semiconductor region 122 of dummy gate 120 from an underlying nanosheet stack 114. In some cases, upper semiconductor region 122 can be replaced with a gate dielectric and/or region of conductive material in a subsequent process. Each gate structure 120 can further include sidewall spacers 124 laterally abutting upper semiconductor region 122. Sidewall spacers 124 may be formed, e.g., by a combination of deposition and etching, over nanosheet stacks 114 and laterally adjacent to upper semiconductor region 122. Sidewall spacers 124 may include any conventional spacer material, such as, for example, an oxide. Gate structure 120 can also include, e.g., upper mask 126 composed of one or more layers of insulative material, and can be positioned on upper semiconductor region 122 to provide further protection of upper semiconductor region 122 and/or other underlying materials during subsequent processing of precursor structure 100.

With continued reference to FIG. 17, embodiments of the disclosure can include forming electrically insulative materials, e.g., encapsulating liner 130, on transistor sites 128 in each region 100S, 100L, and to cover at least a portion of substrate 102 between transistor sites 128. Insulative coating can be formed via deposition or other techniques of forming an insulating material on exposed surfaces, and according to a specific example may include one or more coatings of an oxide material or similar electrically insulative substance.

Figure 18:
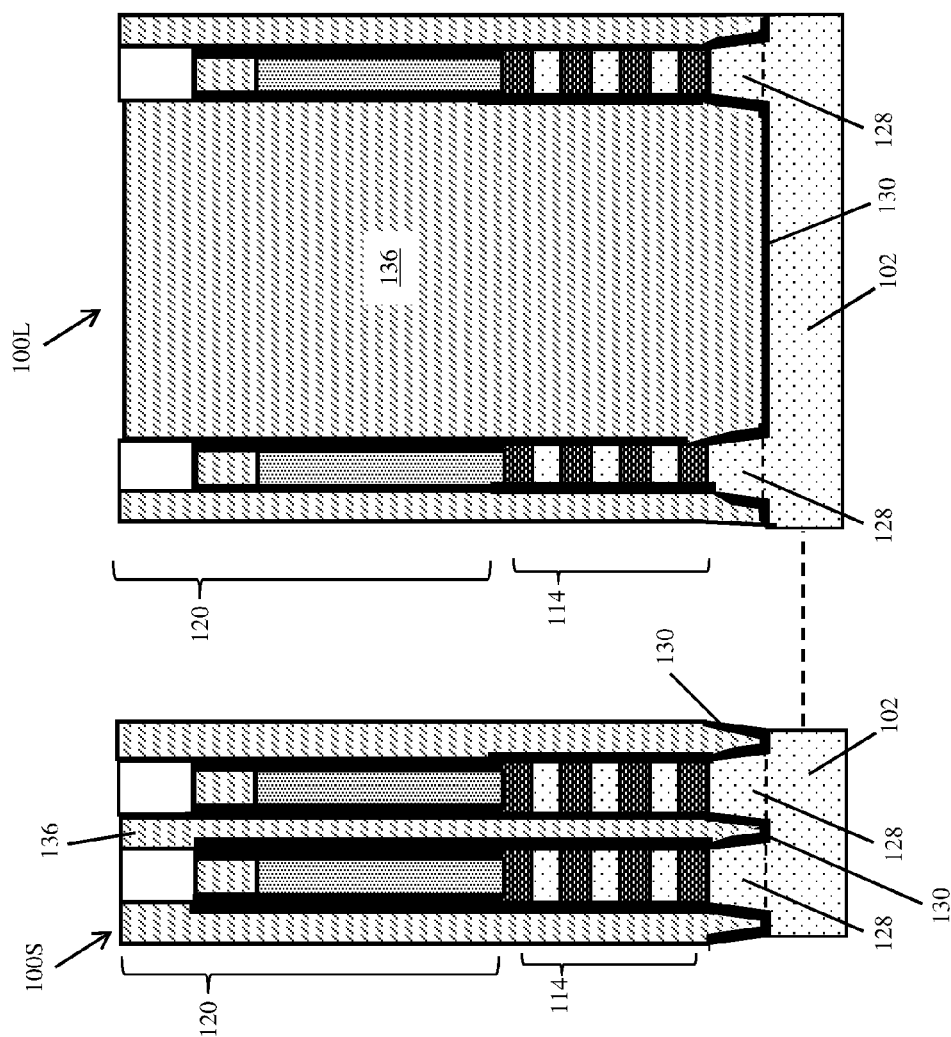
FIG. 18 shows a cross-sectional view of forming a masking layer over the substrate and consecutive gates according to embodiments of the disclosure.

Turning to FIG. 18, further processing according to the disclosure can include forming mask layer 136 on exposed surfaces of encapsulating liner 130, immediately following the forming (e.g., deposition) of encapsulating liner 130 on substrate 102, transistor sites 128, nanosheet stacks 114, and gate structures 120. Regardless of differences in size, separation, distance, etc., in each region 100S, 100L, insulative region 146 can extend vertically between encapsulating liner 130 and at least an upper surface of gate structure 120 in each region 100S, 100L. Mask layer 136 can at least partially include one or more OPL materials and/or other masking materials as described elsewhere herein. Although mask layer 136 can be composed of a single layer of insulative material, it is understood that mask layer 136 may include multiple layers of different materials in alternative embodiments. In any case, encapsulating liner 130 and mask layer thus can be initially be positioned at similar locations within each region 100S, 100L after being formed.

Figure 19:
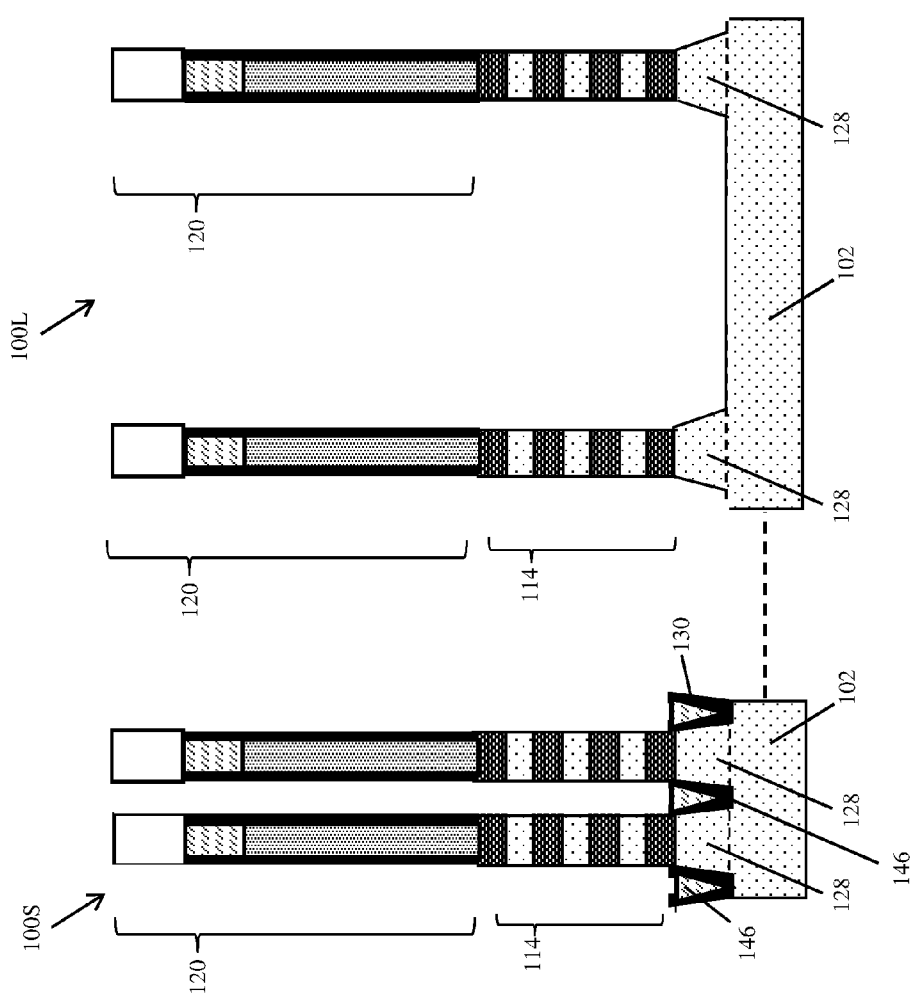
FIG. 19 shows a cross-sectional view of recessing the masking layer to yield a remaining portion in the short channel region, followed by a chamfering of the encapsulation liner, according to embodiments of the disclosure.

Referring now to FIG. 19, the disclosure can include removing portions of encapsulating liner 130 and mask layer 136 from targeted region of each region 100S, 100L. Mask layer 136 and portions of encapsulating liner can be removed in each region 100S, 100L, e.g., by a combination of a selective etching and recessing of OPL or similar masking materials followed by a selective etching or removal of oxide materials, and/or other combinations suitable for removing insulators from a structure (e.g., oxide chamfering). The reduced separation distance between transistor sites 128 in short channel region 100S may impede the ability for etchants and/or other removing materials to contact and react with exposed portions of insulative mask layer 136, thereby causing a difference in etch rate or equivalent rate of reaction within each region 100S, 100L. However, due to the differences in separation distance between adjacent transistor sites 128 within each region 100S, 100L, at least a portion of encapsulating liner 130 may remain intact only within short channel region 100S despite being completely removed from long channel region 100L.

Figure 20:
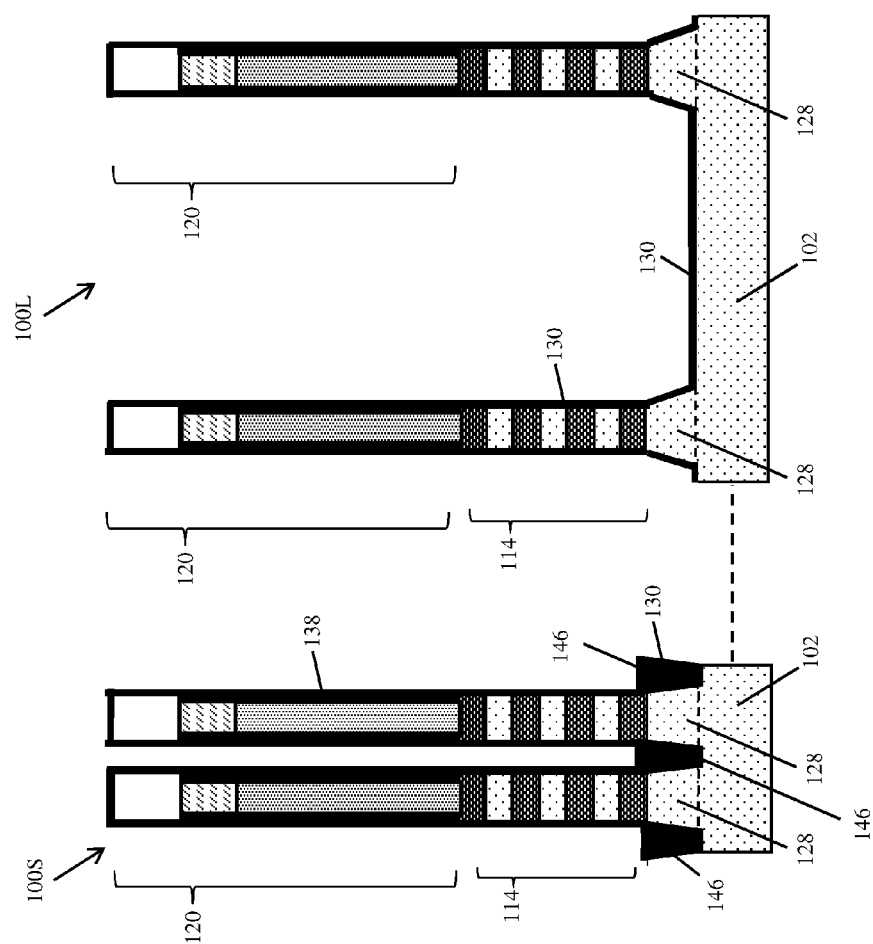
FIG. 20 shows a cross-sectional view of stripping the masking layer in the short channel region and forming another encapsulation liner according to embodiments of the disclosure.

Turning to FIG. 20, an additional insulative coating 138 can be formed conformally on exposed surfaces to define an insulative region 146 within short channel region 100L. As shown, remaining portions of mask layer 136 can be stripped away, and replaced with portions of insulative coating 138 formed between transistor sites 128 in short channel region 100S. As shown, the remaining portions of insulative coating 138 and/or subsequently formed insulative region 146 can together extend from substrate 102 to approximately an upper surface of transistor site 128 or lower portion of nanosheet stacks 114 within short channel region 100S. By contrast, the wider separation between transistor sites 128 of long channel region 100L can cause insulative coating 138 and mask layer 136 to be completely removed in the same process.

Figure 21:
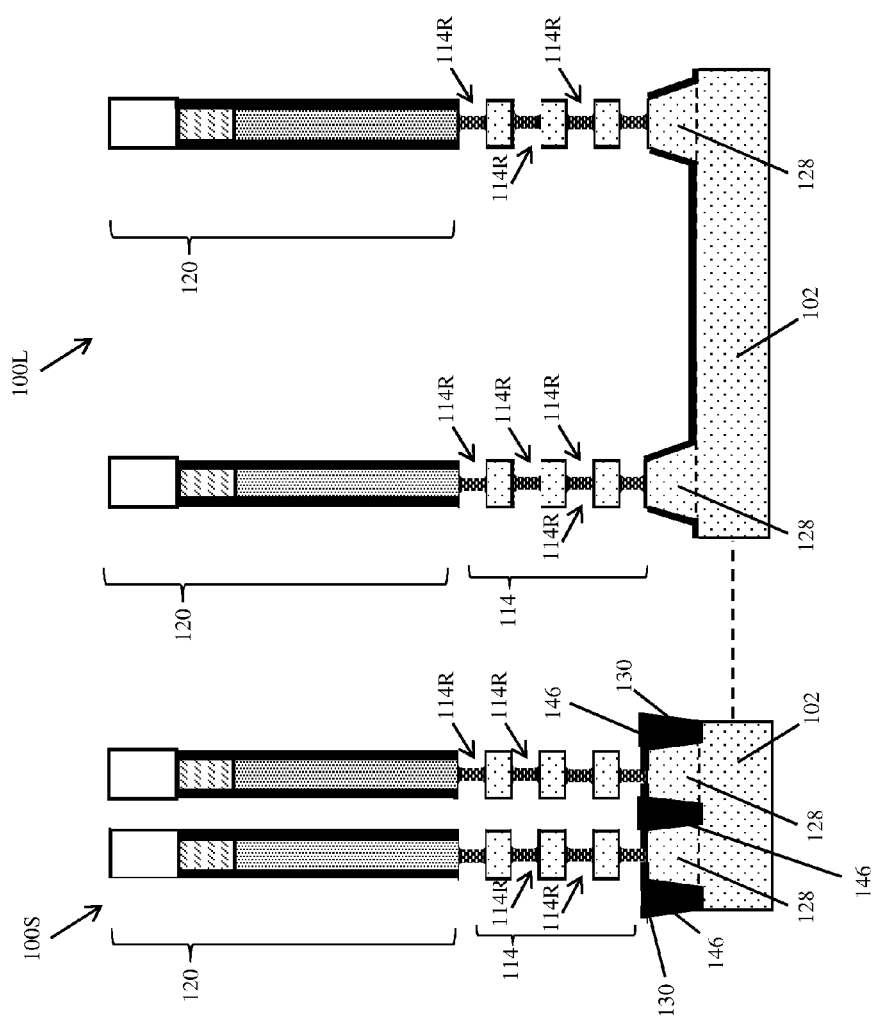
FIG. 21 shows a cross-sectional view of forming inner spacer recesses from alternating nanosheets according to embodiments of the disclosure.

FIG. 21 illustrates a process for laterally recessing alternating nanosheets (e.g., sacrificial nanosheets 118 (FIGS. 1, 17) according to embodiments of the disclosure. After insulative region 146 is formed and defined in short channel region 100S, nanosheet stacks 114 of each region 100S, 100L can be processed to prepare for the subsequent formation of inner spacers on each nanosheet stack 114 and gate structure 120. Alternating nanosheets of each stack 114 can be partially laterally recessed according to any currently known or later developed process for removing lateral portions of a structure, e.g., one or more of the various processes described elsewhere herein for laterally removing portions of a conductive material or semiconductor material. More specifically, nanosheet stacks 114 can be selectively laterally etched by way of wet deposition and or similar processes. Such processes can thereby form a plurality of recesses 114R vertically between alternating nanosheets of nanosheet stack 114, e.g., between semiconductor nanosheets 116 (FIGS. 1, 17) and adjacent to sacrificial nanosheets 118 as described elsewhere herein.

Figure 22:
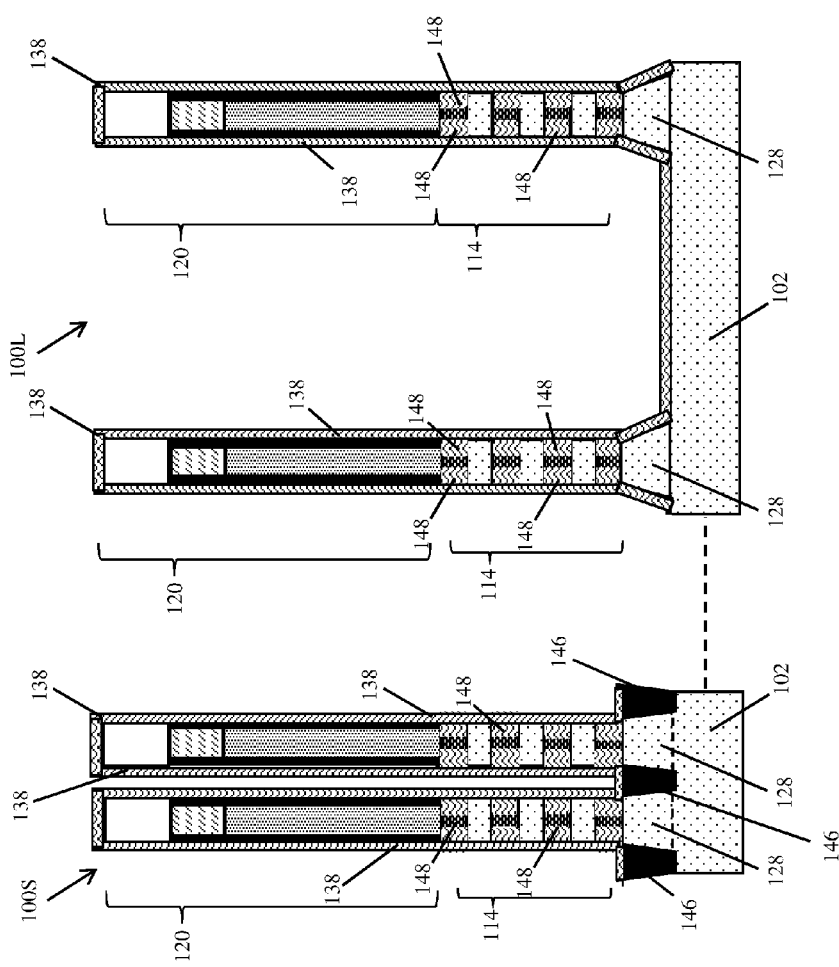
FIG. 22 shows a cross-sectional view of an insulative coating being conformally formed on exposed surfaces to pinch the inner spacer recesses according to embodiments of the disclosure.

Referring now to FIG. 22, embodiments of the disclosure can include forming additional regions of insulative coating 138 on transistor sites 128, nanosheet stack 114, gate structures 120, and directly on insulative regions 146. The additional regions of insulative coating 138 can include, e.g., one or more insulative materials such as a nitride insulator, an oxide insulator, and/or any other currently known or later developed substance configured for use as a spacer material in a transistor. In an example embodiment, insulative coating can be formed on exposed surfaces of transistor sites 128, nanosheet stack 114, gate structures 120, and insulative regions 146 of regions 100S, 100L by way of selective or non-selective deposition on exposed surfaces. According to an example embodiment, insulative coating 138 can be formed selectively on transistor sites 128, nanosheet stacks 114, and gate structures 120 such that substrate 102 does not include insulative coating 138. However formed, portions of insulative coating 138 can be formed between alternating nanosheets of nanosheet stack 114, e.g., vertically between semiconductor nanosheets 116 (FIGS. 1, 14) and laterally adjacent to sacrificial nanosheets 118 (FIGS. 1, 14) after the lateral recessing thereof. Such regions of insulative coating 138 between alternating nanosheets, where recesses 114R (FIG. 17) were previously formed, can define a set of inner spacers 148 within nanosheet stacks 114 and over transistor sites 128.

Figure 23:
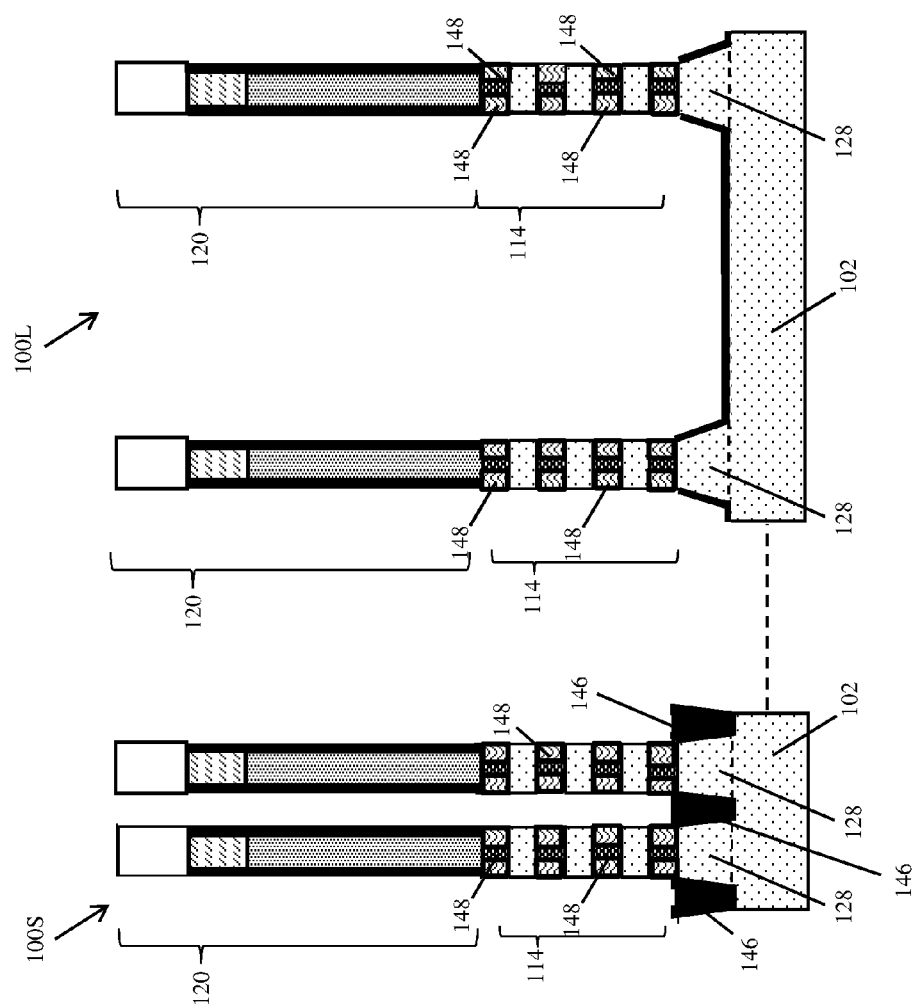
FIG. 23 shows a cross-sectional view of recessing the insulative coating to define inner spacers and expose alternating nanosheets according to embodiments of the disclosure.

Turning to FIG. 23, the disclosure can include removing portions of insulative coating 138 which do not form part of inner spacers 148, thereby permitting transistor sites 128, nanosheet stacks 114, and gate structures 120 to be further processed and/or connected to other components. Portions of insulative coating 138 can be selectively removed with one or more materials configured to dissolve, dislodge, etc., the material composition of insulative coating 138 while leaving other materials on substrate 102 substantially intact. According to an example, a hot phosphorous acid can be applied to etch insulative coating 138. In this case, the amount of acid can be controlled such that inner spacers 148 remain intact on nanosheet stacks 114 within short channel region 110S and long channel region 100L. In addition, any other portions of insulative coating 138 not included within inner spacers 148 can be removed after hot phosphoric acid is applied to the structure for etching. As shown, transistor sites 128 and substrate 102 of long channel region 100L can be exposed after insulative coating 138 is removed. However, insulative region 146 and remaining portions of insulative coating 138 covered by insulative region 146 can protect substrate 102 and transistor sites 128 in short channel region 100S.

Figure 24:
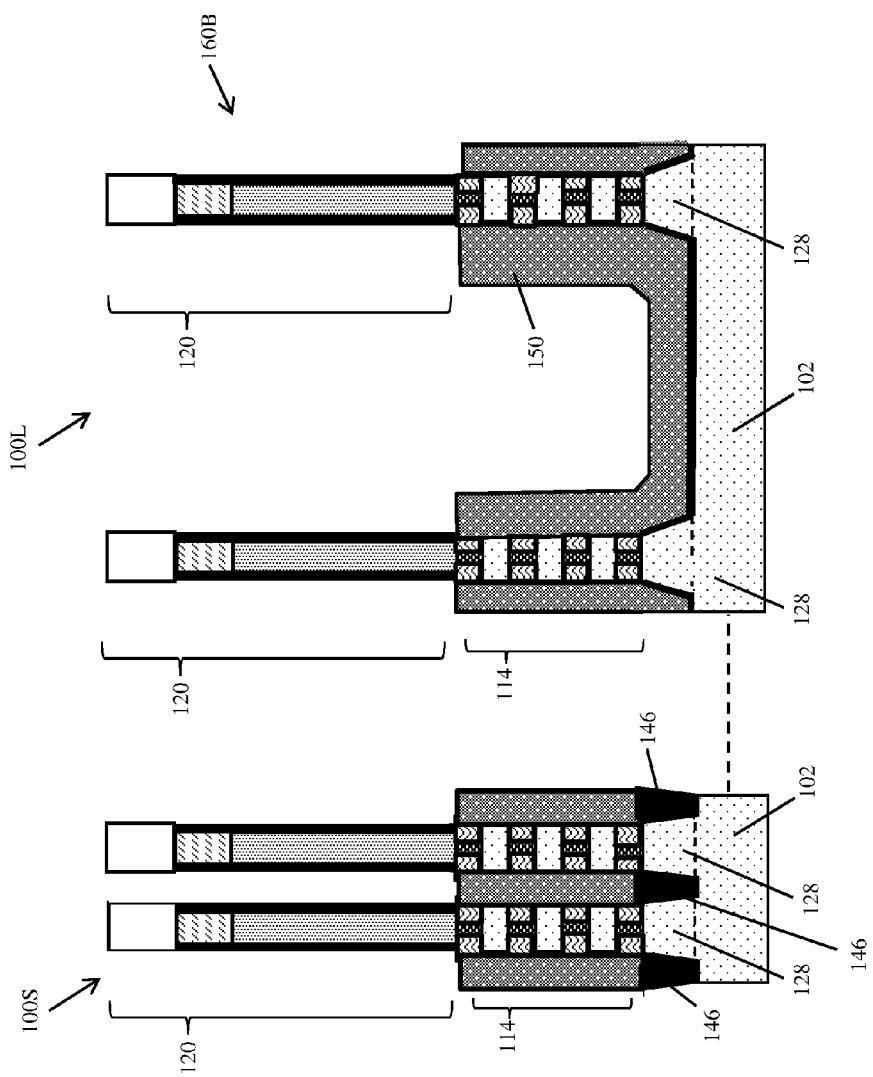
FIG. 24 shows a cross-sectional view of epitaxially growing a source/drain epitaxial region to yield an IC structure according to embodiments of the disclosure.

Referring now to FIG. 24, embodiments of the disclosure further processing can include epitaxially forming source/drain regions for nanosheet transistors to yield, e.g., an IC structure 160B according to the disclosure. Similar to other processes discussed herein, the disclosure can include epitaxially growing source/drain epitaxial region 150 between respective pairs of nanosheet stacks 114, e.g., from exposed sidewalls of semiconductor nanosheets 116 (FIG. 14) in each region 100S, 100L. In addition, substrate 102 remaining exposed in long channel region 100L can allow source/drain epitaxial region 150 to also be grown from exposed surfaces of substrate 102 between transistor sites 128. Source/drain epitaxial region 150 may include, e.g., crystalline silicon based on the composition of semiconductor nanosheets 116 and/or substrate 102, where applicable. In this situation, semiconductor regions 146 may be positioned directly beneath source/drain epitaxial regions 150 of short channel region 100S, while being absent in long channel region 100L due to the lack of semiconductor mandrel 142 (FIGS. 10-15).

As noted elsewhere herein, source/drain epitaxial region 150 in each region 100S, 100L may form part of an electrical connection to nanosheet stacks 114, e.g., to provide an electrical connection to nanosheet stacks 114 according to embodiments of the disclosure. Source/drain epitaxial regions 150 can be formed together in short channel region 100S and long channel region 100L above substrate 102, and in contact with insulative regions 146 of short channel region 100S, as a result of forming insulative regions 146 only in targeted areas (e.g., short channel region 100S) as noted herein. After being formed, source/drain epitaxial regions 150 in long channel region 100L can each be positioned between respective pairs of transistor sites 128 and directly on substrate 102. Due to the relative positions and separation distances between transistor sites 128 and nanosheet stacks 114 in long channel region 100L, source/drain epitaxial region 150 of IC structure 160 may also take on a substantial U-shape or other stepped geometry upon being formed. Forming source/drain epitaxial region 150 in each region 100S, 100L can thereby yield an IC structure 160B according to embodiments of the disclosure.

Figure 25:
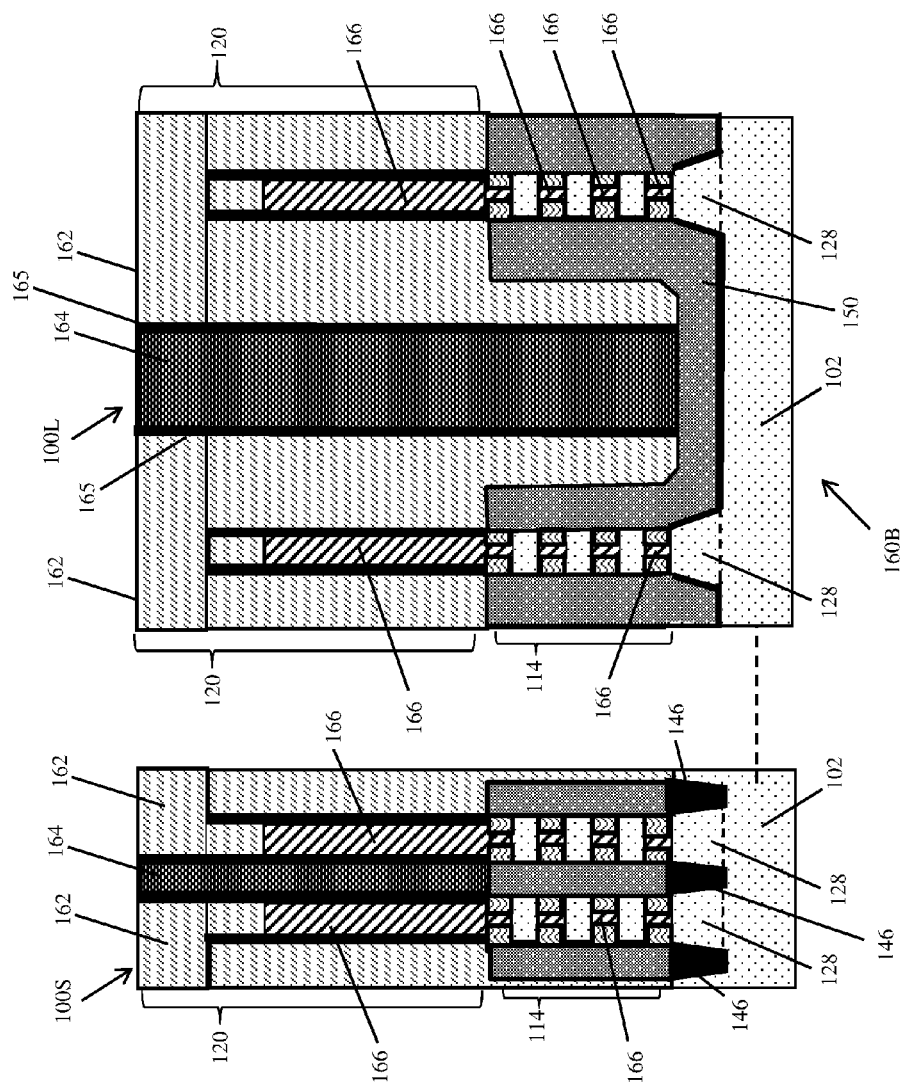
FIG. 25 shows a cross-sectional view of the formed IC structure after the first level of metal contact on source/drain epitaxial regions by embodiments of the disclosure.

Turning to FIG. 25, further processing according to the disclosure can include forming insulator 162, trench silicide 164, and/or protective liner 165 on each region 100S, 100L, as described elsewhere herein relative to different implementations. As described herein, insulator 162 can be formed adjacent to gate structures 120 in each region 100S, 100L. Insulator 162 can also at least partially cover source/drain epitaxial regions 150 in each region 100S, 100L of IC structure 160B. The composition of insulator 162 can be composed of any currently known or later developed insulative material, e.g., one or more insulators included within gate structures 120 and/or insulative regions 146. Before insulator 162 is formed, other insulative components of each gate structure 120 (e.g., upper masks 126 (FIGS. 1, 14) can be removed to allow insulator 162 to be formed thereon. As shown, further modifications to IC structure 160B can include, e.g., removing targeted portions of insulator 162 over source/drain epitaxial region 150 to form trench silicide 164 to source/drain epitaxial region 150 to provide a gate contact to nanosheet stacks 114. Remaining portions of insulator 162 positioned between gate structures 120 and trench silicide 164 or protective liners 165 can define a set of insulative caps each positioned on respective gate structures 120 and portions of source/drain epitaxial region 150. Trench silicide 164, as shown, can extend substantially from source/drain epitaxial region 150 to an upper surface of insulator 162. In addition, sacrificial nanosheets 118 (FIG. 14) can be replaced with work function metal 166 according to other processes described herein, e.g., selectively etching targeted semiconductor compositions for replacement with work function metal 166 by deposition. The resulting IC structure 160B according to the disclosure thus can include short channel region 100S and long channel region 100L with source/drain epitaxial regions 150 positioned between laterally adjacent nanosheet stacks 114, and with insulative regions 146 present only between transistor sites 128 of short channel region 100S. Although multiple IC structures 160 (FIGS. 15-16), 160B (FIGS. 24-25) are shown and discussed with respect to corresponding processing techniques, it is understood that structures 160, 160B can be formed together on respective portions of the same substrate 102, and/or may be formed independently on multiple substrates 102.

The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. For example, while the present disclosure describes a process related to nanosheet devices, it is anticipated that a similar process may be applied to FinFET devices. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A method of forming an integrated circuit (IC) structure, the method comprising:
   forming an insulative liner on an upper surface of a substrate, the substrate being included in a precursor structure, the precursor structure having:
      a pair of laterally spaced transistor sites defined within the substrate, wherein the insulative liner is formed on the upper surface of the substrate laterally between the pair of transistor sites,
      a pair of nanosheet stacks, each positioned on one of the pair of transistor sites, and
      a pair of gate structures each positioned on a respective one of the pair of nanosheet stacks;
   forming a sacrificial structure on the insulative liner, wherein the sacrificial structure includes:
      a semiconductor mandrel positioned on the insulative liner, and
      a mask layer positioned on the semiconductor mandrel, wherein an upper surface of the mask layer is positioned above the pair of gate structures;
   forming a pair of insulator regions, each of the pair of insulator regions positioned laterally between the sacrificial structure and one of the pair of transistor sites; and
   removing the mask layer to expose the upper surface of the semiconductor mandrel; and
   epitaxially growing a source/drain epitaxial region between the pair of nanosheet stacks, from exposed sidewalls of the pair of nanosheet stacks and the exposed upper surface of the semiconductor mandrel.

2. The method of claim 1, wherein forming the sacrificial structure further includes:
   depositing a sacrificial semiconductor layer over the substrate and the pair of transistor sites;
   forming a recess within the sacrificial semiconductor layer laterally between the pair of transistor sites, wherein a lower surface of the recess is substantially aligned with a nanosheet in each of the pair of nanosheet stacks, and wherein the recess includes a pair of sidewalls laterally separated from sidewalls of the pair of transistor sites;
   forming the mask layer within the recess; and
   removing portions of the sacrificial semiconductor layer not positioned beneath the mask layer, such that a remainder of the sacrificial semiconductor layer defines the semiconductor mandrel after the removing.

3. The method of claim 2, wherein forming the insulative liner on the upper surface of the substrate includes:
   forming an insulative coating on exposed surfaces of the substrate, the pair of transistor sites, the pair of nanosheet stacks, and the pair of gate structures; and
   removing the insulative coating from exposed surfaces of the pair of transistor sites, the pair of nanosheet stacks, and the pair of gate structures after removing portions of the sacrificial semiconductor layer, such that a remainder of the insulative coating positioned between the substrate and the semiconductor mandrel defines the insulative liner.

4. The method of claim 1, further comprising, before forming the pair of insulator regions:
   laterally recessing a set of alternating nanosheets in each of the pair of nanosheet stacks to yield a plurality of lateral recesses in the pair of nanosheet stacks; and
   forming an insulative coating on exposed surfaces of the substrate, the pair of transistor sites, the pair of nanosheet stacks, the pair of gate structures, and the sacrificial structure, wherein a portion of the insulative coating fills the plurality of lateral recesses.

5. The method of claim 4, further comprising, after forming the pair of insulator regions, removing the insulative coating from surfaces of the pair of nanosheet stacks, the pair of gate structures, and the sacrificial structure, such that a remaining portion of the insulative coating positioned within the plurality of lateral recesses of the pair of nanosheet stacks defines an inner spacer.

6. The method of claim 1, further comprising, after growing the source/drain epitaxial region:
   forming an insulator on each of the pair of gate structures and the source/drain epitaxial region;
   forming an opening within the insulator to expose an upper surface of the source/drain epitaxial region between the pair of nanosheet stacks, wherein remaining portions of the insulator define a pair of insulative caps each positioned on one of the pair of gate structures and directly on a portion of the source/drain epitaxial region; and
   forming a trench silicide within the opening, such that the trench silicide is positioned on the source/drain epitaxial region and laterally between the pair of insulative caps, wherein a lateral width of each of the pair of insulative caps between the gate structure and the trench silicide is approximately equal to a lateral width of the pair of insulative regions between each of the pair of transistor sites and the semiconductor mandrel.

7. The method of claim 1, wherein the semiconductor mandrel comprises an amorphous semiconductor, and wherein the source/drain epitaxial region comprises a crystalline semiconductor.

8. A method of forming an integrated circuit (IC) structure, the method comprising:
   forming a first pair of transistor sites and a second pair of transistor sites from a substrate, wherein a lateral separation distance between the first pair of transistor sites is less than a separation distance between the second pair of transistor sites, and wherein each of the first pair of transistor sites and the second pair of transistor sites includes a pair of nanosheet stacks each positioned on a respective one of the pair of transistor sites, and a pair of gate structures each positioned on a respective one of the pair of transistor sites;
   selectively forming an insulative region between the first pair of transistor sites to cover a first portion of the substrate between the first pair of transistor sites, wherein the second pair of transistor sites and a second portion of the substrate between the second pair of transistor sites remain exposed after the selective forming of an insulative liner;
   epitaxially growing a first source/drain epitaxial region between the first pair of semiconductor transistor sites, from exposed portions of the pair of nanosheet stacks on the first pair of transistor sites, such that the first source/drain epitaxial region overlies the insulative region; and
   epitaxially growing a second source/drain epitaxial region between the second pair of semiconductor transistor sites, from the second portion of the substrate and exposed portions of the pair of nanosheet stacks on the second pair of transistor sites.

9. The method of claim 8, wherein a lower surface of the first source/drain epitaxial region is positioned above a lower surface of the second source/drain epitaxial region, and wherein the second source/drain epitaxial region contacts and overlies the substrate.

10. The method of claim 8, further comprising, before epitaxially growing the first and second source/drain epitaxial regions:
laterally recessing a set of alternating nanosheets in each of the nanosheet stacks over the first and second pairs of transistor sites to yield a plurality of lateral recesses in each nanosheet stack; and
forming an insulative region on exposed surfaces of at least the substrate, the nanosheet stacks, and the gate structures, wherein a portion of the insulative region fills the plurality of lateral recesses.

11. The method of claim 10, further comprising, after forming the insulative region, removing the inner spacer from surfaces of the substrate, the nanosheet stacks, and the gate structures, such that a remaining portion of the insulative region positioned within the plurality of lateral recesses of the nanosheet stacks defines an inner spacer.

12. The method of claim 8, wherein the epitaxial growing of the first source/drain epitaxial region occurs simultaneously with the epitaxial growing of the second source/drain epitaxial region.

13. The method of claim 8, wherein selectively forming the insulative region between the first pair of transistor sites includes:
forming the insulative liner on exposed surfaces of the substrate, the first pair of transistor sites, the second pair of transistor sites, the nanosheet stacks, and the gate structures;
forming a masking layer on the substrate such that the masking layer covers the first pair of transistor sites, the second pair of transistor sites, the nanosheet stacks, and the gate structures;
removing the insulative liner and the masking layer from at least the second portion of the substrate, the nanosheet stacks, and the gate structures, such that a remaining portion of the insulative liner and the masking layer is positioned on the first portion of the substrate and between the first pair of transistor sites;
removing the masking layer from between the first pair of transistor sites to yield a lateral gap therebetween; and
forming an insulator within the lateral gap between the first pair of transistor sites.

14. The method of claim 13, wherein forming the insulator within the lateral gap between the first pair of transistor sites includes:
forming a insulative coating within the lateral gap and on exposed surfaces of the substrate, the second pair of transistor sites, the nanosheet stacks, and the gate structures; and
removing the insulative coating from the second portion of the substrate, the nanosheet stacks, and the gate structures, such that remaining portions of the insulative liner and the insulative coating define the insulator within the lateral gap between the first pair of transistor sites.

\* \* \* \* \*